United States Patent
Jang et al.

(10) Patent No.: US 12,557,457 B2
(45) Date of Patent: Feb. 17, 2026

(54) LED CHIP PACKAGE AND MANUFACTURING METHOD OF THE SAME

(71) Applicant: SEOUL VIOSYS CO., LTD., Ansan-si (KR)

(72) Inventors: Jong Min Jang, Ansan-si (KR); Chang Yeon Kim, Ansan-si (KR); Myoung Hak Yang, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/232,371

(22) Filed: Aug. 10, 2023

(65) Prior Publication Data

US 2023/0387178 A1    Nov. 30, 2023

Related U.S. Application Data

(63) Continuation of application No. 16/858,674, filed on Apr. 26, 2020, now Pat. No. 11,756,980.

(Continued)

(51) Int. Cl.
  *H10H 29/10* (2025.01)
  *H10H 20/831* (2025.01)
  (Continued)

(52) U.S. Cl.
  CPC .......... *H10H 29/10* (2025.01); *H10H 20/831* (2025.01); *H10H 20/84* (2025.01); *H10H 20/8506* (2025.01); *H10H 20/854* (2025.01)

(58) Field of Classification Search
  None
  See application file for complete search history.

(56) References Cited

U.S. PATENT DOCUMENTS

| 5,696,389 A | 12/1997 | Ishikawa et al. |
| 6,964,877 B2 | 11/2005 | Chen et al. |

(Continued)

FOREIGN PATENT DOCUMENTS

| CN | 105529343 A | 4/2016 |
| CN | 106935607 A | 7/2017 |

(Continued)

OTHER PUBLICATIONS

International Search Report mailed Aug. 26, 2020 in WO Patent Application No. PCT/KR2020/006280.

(Continued)

*Primary Examiner* — Su C Kim
(74) *Attorney, Agent, or Firm* — Oblon, McClelland, Maier & Neustadt, L.L.P.

(57) ABSTRACT

A light emitting module including a substrate, a first light emitter, a second light emitter, and a third light emitter, in which at least two of the first, second, and third emitters are disposed one over another, connection electrodes electrically connected to at least one of the first, second, and third light emitters, a passivation layer covering at least one side surface of the connection electrodes and exposing at least a region of the first light emitter, and a first electrode electrically connected to at least one of the connection electrodes, in which the first electrode is electrically connected to at least one of the first, second, and third electrodes through the at least one of the connection electrodes, and at least one of connection electrodes overlaps side surfaces of two or more of the first, second, and third light emitters in a plan view.

20 Claims, 21 Drawing Sheets

Related U.S. Application Data

(60) Provisional application No. 62/870,855, filed on Jul. 5, 2019, provisional application No. 62/847,875, filed on May 14, 2019.

(51) Int. Cl.
  *H10H 20/84* (2025.01)
  *H10H 20/85* (2025.01)
  *H10H 20/854* (2025.01)

(56) References Cited

U.S. PATENT DOCUMENTS

| | | | |
|---|---|---|---|
| 8,952,416 | B2 | 2/2015 | Jeong |
| 9,006,764 | B2 | 4/2015 | Akimoto et al. |
| 9,825,016 | B1 | 11/2017 | Kim et al. |
| 10,937,924 | B2 | 3/2021 | Zou et al. |
| 11,282,981 | B2 | 3/2022 | Kim et al. |
| 11,322,488 | B2 | 5/2022 | Chang |
| 11,450,648 | B2 | 9/2022 | Jang et al. |
| 11,587,914 | B2 | 2/2023 | Jang et al. |
| 11,756,980 | B2 * | 9/2023 | Jang .................. H01L 33/56 257/98 |
| 2003/0160251 | A1 * | 8/2003 | Wanlass ............... H10F 19/904 257/82 |
| 2003/0213967 | A1 | 11/2003 | Forrest et al. |
| 2006/0255343 | A1 | 11/2006 | Ogihara et al. |
| 2007/0069220 | A1 | 3/2007 | Ogihara |
| 2007/0170444 | A1 * | 7/2007 | Cao .................... H10H 29/14 257/E33.012 |
| 2008/0251799 | A1 * | 10/2008 | Ikezawa ............. H01L 25/0756 257/89 |
| 2008/0308819 | A1 | 12/2008 | Louwsma et al. |
| 2009/0078955 | A1 * | 3/2009 | Fan .................... H01L 27/15 438/46 |
| 2010/0051975 | A1 | 3/2010 | Suzuki et al. |
| 2011/0186876 | A1 | 8/2011 | Suzuki et al. |
| 2012/0074441 | A1 | 3/2012 | Seo et al. |
| 2013/0119424 | A1 * | 5/2013 | Kang .................. H01L 33/50 257/98 |
| 2013/0161628 | A1 | 6/2013 | Suzuki et al. |
| 2014/0217438 | A1 | 8/2014 | Tomizawa et al. |
| 2014/0284633 | A1 | 9/2014 | Tsay et al. |
| 2015/0116985 | A1 | 4/2015 | Bang |
| 2016/0163765 | A1 | 6/2016 | Hu et al. |
| 2017/0033268 | A1 | 2/2017 | Lee et al. |
| 2017/0077367 | A1 | 3/2017 | Shimojuku et al. |
| 2017/0288093 | A1 | 10/2017 | Cha et al. |
| 2017/0309678 | A1 | 10/2017 | Yang et al. |
| 2017/0338210 | A1 | 11/2017 | Kim et al. |
| 2019/0006413 | A1 | 1/2019 | Jacob et al. |
| 2019/0006561 | A1 | 1/2019 | Chun-Hung et al. |
| 2020/0219858 | A1 | 7/2020 | Chang |
| 2020/0365648 | A1 | 11/2020 | Jang et al. |

FOREIGN PATENT DOCUMENTS

| | | |
|---|---|---|
| CN | 107342352 | 11/2017 |
| CN | 108258095 A | 7/2018 |
| EP | 2768033 | 8/2014 |
| EP | 3944315 A1 | 1/2022 |
| JP | H06-13655 | 1/1994 |
| JP | 7-254732 | 10/1995 |
| JP | 2008-263127 | 10/2008 |
| JP | 2014-187366 A | 10/2014 |
| JP | 2016-174020 A | 9/2016 |
| JP | 2017-55038 A | 3/2017 |
| JP | 2017-108091 A | 6/2017 |
| KR | 10-2006-0020605 | 3/2006 |
| KR | 10-2015-0002113 A | 1/2015 |
| WO | 2018064805 | 4/2018 |
| WO | 2019004508 | 1/2019 |
| WO | 2019103566 A1 | 5/2019 |
| WO | 2020231108 A1 | 11/2020 |

OTHER PUBLICATIONS

Non-Final Office Action mailed Dec. 21, 2020, in U.S. Appl. No. 16/849,842.
Non-Final Office Action mailed Dec. 21, 2020, in U.S. Appl. No. 16/848,914.
Non-Final Office Action mailed Oct. 6, 2021, in U.S. Appl. No. 16/852,522.
Final Office Action mailed Apr. 4, 2022, in U.S. Appl. No. 16/852,522.
Non-Final Office Action mailed Sep. 1, 2022, in U.S. Appl. No. 16/852,522.
Final Office Action mailed Aug. 4, 2022, in U.S. Appl. No. 16/849,842.
Final Office Action mailed Aug. 3, 2022, in U.S. Appl. No. 16/848,914.
Notice of Allowance mailed Dec. 21, 2022, in U.S. Appl. No. 16/855,522.
Non-Final Office Action mailed Dec. 13, 2022, in U.S. Appl. No. 16/848,914.
Non-Final Office Action mailed Dec. 13, 2022, in U.S. Appl. No. 16/849,842.
Extended European Search Report dated Apr. 13, 2023, issued in European Patent Application No. 20805270.4.
Extended European Search Report dated Apr. 25, 2023, issued in European Patent Application No. 20805420.5.
Extended European Search Report dated May 2, 2023, issued in European Patent Application No. 20804781.1.
Extended European Search Report dated Apr. 28, 2023, issued in European Patent Application No. 20804981.7.
Final Office Action mailed Jun. 5, 2023, in U.S. Appl. No. 16/849,842.
Final Office Action mailed May 31, 2023, in U.S. Appl. No. 16/848,914.
Non-Final Office Action mailed Dec. 21, 2021, in U.S. Appl. No. 16/858,674.
Final Office Action mailed Jul. 21, 2022, in U.S. Appl. No. 16/858,674.
Non-Final Office Action mailed Nov. 9, 2022, in U.S. Appl. No. 16/858,674.
Notice of Allowance mailed May 1, 2023, in U.S. Appl. No. 16/858,674.
Corrected Notice of Allowance mailed Jun. 5, 2023, in U.S. Appl. No. 16/858,674.
Notice of Allowance mailed Jul. 6, 2023, in U.S. Appl. No. 16/858,674.
Notice of Allowance mailed Sep. 27, 2023, in U.S. Appl. No. 16/849,842.
Japanese Office Action issued Apr. 23, 2024 in Japanese Patent Application No. 2021-566350, 5 pages.
Office Action mailed Oct. 29, 2024 in Japanese Application No. 2021-566350 filed May 13, 2020 (w/English translation).
Office Action mailed Nov. 12, 2024 in Korean Application No. 10-2021-7038625 filed May 13, 2020 (w/English translation).
Decision of Rejection issued on Dec. 10, 2024, in Chinese Patent Application 202080035650.3, therein, 12 pages.
Combined Chinese Office Action and Search Report issued May 17, 2025 in Chinese Patent Application No. 202080035650.3, 10 pages.

* cited by examiner

LED CHIP PACKAGE AND MANUFACTURING METHOD OF THE SAME

CROSS-REFERENCE TO RELATED APPLICATIONS

This application is a Continuation of U.S. patent application Ser. No. 16/858,674, filed on Apr. 26, 2020, which claims the benefit of U.S. Provisional Application No. 62/847,875, filed on May 14, 2019, and U.S. Provisional Application No. 62/870,855, filed on Jul. 5, 2019, each of which is hereby incorporated by reference for all purposes as if fully set forth herein.

BACKGROUND

Field

Exemplary embodiments of the invention relate to a light emitting chip for a display and a manufacturing method of the same and, more specifically, to a micro light emitting chip having a stacked structure and a manufacturing method of the same.

Discussion of the Background

As an inorganic light source, light emitting diodes (LEDs) have been used in various technical fields, such as displays, vehicular lamps, general lighting, and the like. With advantages of long lifespan, low power consumption, and high response speed, light emitting diodes have been rapidly replacing an existing light source.

Light emitting diodes have been mainly used as backlight light sources in display apparatus. However, micro-LED displays have been recently developed that are capable of implementing an image directly using the light emitting diodes.

In general, a display apparatus implements various colors by using mixed colors of blue, green and, red light. The display apparatus includes pixels each having sub-pixels corresponding to blue, green, and red colors, and a color of a certain pixel may be determined based on the colors of the sub-pixels therein, and an image can be displayed through selective activation of a combination of the pixels.

Since LEDs can emit various colors depending upon its constituent materials, a display apparatus may typically have individual LED chips emitting blue, green, and red light arranged on a two-dimensional plane. However, when one LED chip is provided for each sub-pixel, the number of LED chips required to be mounted to form a display device becomes very large, e.g., over hundreds of thousands or millions, which may require a significant amount of time and complexity for the mounting process. Moreover, since the sub-pixels are arranged on the two-dimensional plane in a display apparatus, a relatively large area is required for one pixel including the sub-pixels for blue, green, and red light, and reducing the luminous area of each sub-pixel would deteriorate the brightness of the sub-pixels.

Moreover, micro-LEDs typically have a very small size with a surface area of about 10,000 square m or less, and thus, various technical problems arise due to this small size. For example, an array of micro-LEDs is formed on a substrate, and the micro-LEDs may be singularized into each micro-LED chip by cutting the substrate. The individualized micro-LED chips may then be mounted on another substrate, such as a printed circuit board, during which various transferring technologies may be employed. However, during these transferring steps, handling of each micro-LED chip is generally difficult due to its small size and its vulnerable structure. Furthermore, electrodes formed on a target substrate, such as that of a display device, generally are spaced apart from each other at a pitch that corresponds to the pitch of the electrodes of conventional pixels having multiple sub-pixels arranged on a two-dimensional plane.

The above information disclosed in this Background section is only for understanding of the background of the inventive concepts, and, therefore, it may contain information that does not constitute prior art.

SUMMARY

Light emitting chips constructed according to the principles and some exemplary implementations of the invention are capable of protecting the light emitting stacked structures during various transferring processes.

Light emitting chips, e.g., micro-LEDs, and a display using the same constructed according to the principles and some exemplary implementations of the invention have a simplified structure that reduces the time for the mounting process during manufacture.

Light emitting chips, e.g., micro-LEDs, constructed according to the principles and some exemplary implementations of the invention are capable of being mounted on a conventional display device with enhanced internal structure that facilitates handling and transfer.

Light emitting packages, e.g., micro-LEDs, constructed according to the principles and some exemplary implementations of the invention have increased light efficacy and color purity, which is achieved by removing a substrate of a light emitting stacked structure, such as a growth substrate of one of the LED stacks.

Additional features of the inventive concepts will be set forth in the description which follows, and in part will be apparent from the description, or may be learned by practice of the inventive concepts.

A light emitting package according to an exemplary embodiment includes a first LED sub-unit having first and second opposed surfaces, a second LED sub-unit disposed on the second surface of the first LED sub-unit, a third LED sub-unit disposed on the second LED sub-unit, a plurality of connection electrodes having side surfaces and electrically connected to at least one of the first, second, and third LED sub-units, the connection electrodes covering a side surface of at least one of the first, second, and third LED sub-units, a first passivation layer surrounding at least the sides surfaces of the connection electrodes, the first passivation layer exposing at least a portion of the first surface of the first LED sub-unit, a substrate having first and second opposed surfaces, with the first surface of the substrate facing the LED sub-units, and a first electrode disposed on the first surface of the substrate and connected to at least one of the connection electrodes.

The connection electrodes may overlap at least one of the first, second, and third LED sub-units.

The light emitting package may further include a second passivation layer contacting the side surfaces of at least some of the connection electrodes.

The second passivation layer may be disposed between the connection electrodes.

The first passivation layer may include at least one of a black epoxy molding compound and a polyimide film.

The first electrode may include a plurality of contact electrodes, each of which are spaced from each other by a first distance and corresponds to one of the connection electrodes, the light emitting package may further include second electrodes disposed on the second surface of the substrate, each of which are spaced from each other by a second distance and connected to respective ones of the contact electrodes, and the second distance may be greater than the first distance.

The first passivation layer and the second passivation layer may include different materials.

The first LED sub-unit may include a first LED light emitting stack, the second LED sub-unit may include a second LED light emitting stack, the third LED sub-unit may include a third LED light emitting stack, the first, second, and third LED light emitting stacks may have successively smaller regions overlapping with the substrate, and at least one of the LED light emitting stacks may include a micro-LED having a surface area less than about 10,000 square μm.

The light emitting package may further include a second passivation layer disposed between the connection electrodes and the third LED sub-unit, in which an angle defined between a side surface of the second passivation layer and the first surface of the first LED sub-unit may be less than about 80°.

At least one of the connection electrodes may cover at least a side surface and a top surface of the second passivation layer.

A light emitting package according to another exemplary embodiment includes a first LED sub-unit having first and second opposed surfaces, a second LED sub-unit disposed on the second surface of the first LED sub-unit, a third LED sub-unit disposed on the second LED sub-unit, a plurality of connection electrodes having side surfaces and electrically connected to at least one of the first, second, and third LED sub-units, the connection electrodes covering a side surface of at least one of the first, second, and third LED sub-units, a first passivation layer surrounding at least the sides surfaces of the connection electrodes and having a portion covering at least part of the first surface of the first LED sub-unit, a substrate having first and second opposed surfaces, with the first surface of the substrate facing the LED sub-units, and a first electrode disposed on the first surface of the substrate and connected to at least one of the connection electrodes.

The portion of the first passivation layer covering the first surface of the first LED sub-unit may have a thickness of less than about 100 μm.

The first passivation layer may contact the first surface of the first LED sub-unit.

The light emitting package may further include a second electrode disposed on the second surface of the substrate and connected to the first electrode, in which the second electrode may include a first portion overlapping at least one of the LED sub-units and having a first area, and a second portion not overlapping at least one of the LED sub-units and having a second area that is greater than the first area.

The light emitting package may further include a second passivation layer contacting at least side surfaces of the connection electrodes.

The first passivation layer and the second passivation layer may include different materials.

At least one of the connection electrodes may contact a side surface and a top surface of the second passivation layer.

At least one of the connection electrodes may have an angled shape.

The first passivation layer may be disposed between the connection electrodes.

At least one of the connection electrodes may have first and second opposed surfaces, with the first surface facing the LED sub-units, and the first surface of the connection electrode may have an area greater than the area of the second surface.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
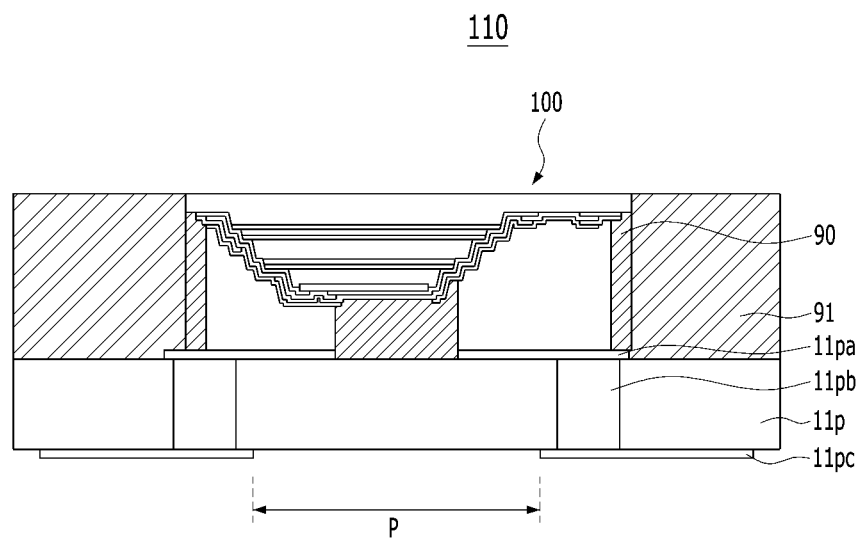
FIG. 1 is a schematic cross-sectional view of a light emitting package constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be described in detail with reference to the accompanying drawings. As used herein, a light emitting stacked structure, a light emitting chip, a light emitting package, or a light emitting module according to exemplary embodiments may include a micro-LED, which has a surface area less than about 10,000 square µm as known in the art. In other exemplary embodiments, the micro-LED's may have a surface area less than about 4,000 square µm, or less than about 2,500 square µm, depending upon the particular application.

FIG. 1 is a schematic cross-sectional view of a light emitting package constructed according to an exemplary embodiment of the invention.

Referring to FIG. 1, a light emitting package 110 according to the illustrated exemplary embodiment includes a light emitting chip 100, a passivation layer 90 surrounding at least the sides of the light emitting chip 100, a molding layer 91 surrounding at least the sides of the passivation layer 90, and a circuit board 11p. An array of the light emitting chips may be formed on a substrate, and the light emitting chip 100 included in the light emitting package 110 of FIG. 1 exemplarily shows one that has been singularized from the array, which is then further processed to form the light emitting package 110.

The light emitting chip 100 according to an exemplary embodiment may include at least two or more light emitting sub-units or light emitting stacks disposed one over another, such as in a vertical direction. In this manner, the light emitting chip 100 may display various colors of light depending on the operating status of each light emitting stack, whereas a conventional light emitting device may display various colors by a combination of multiple light emitting cells emitting a single color of light. More particularly, a conventional light emitting device generally includes light emitting cells that respectively emit different color of light, e.g., red, green, and blue, which are spaced apart from each other along a two dimensional plane, to implement a full color display. As such, a relatively large area may be occupied by the conventional light emitting cells. The light emitting chip 100 constructed according to an exemplary embodiment, however, can emit light having various colors by stacking a plurality of light emitting stacks, thereby providing a high level of integration and implementing a full color spectrum through a significantly smaller area than that in the conventional light emitting device.

Figure 3:
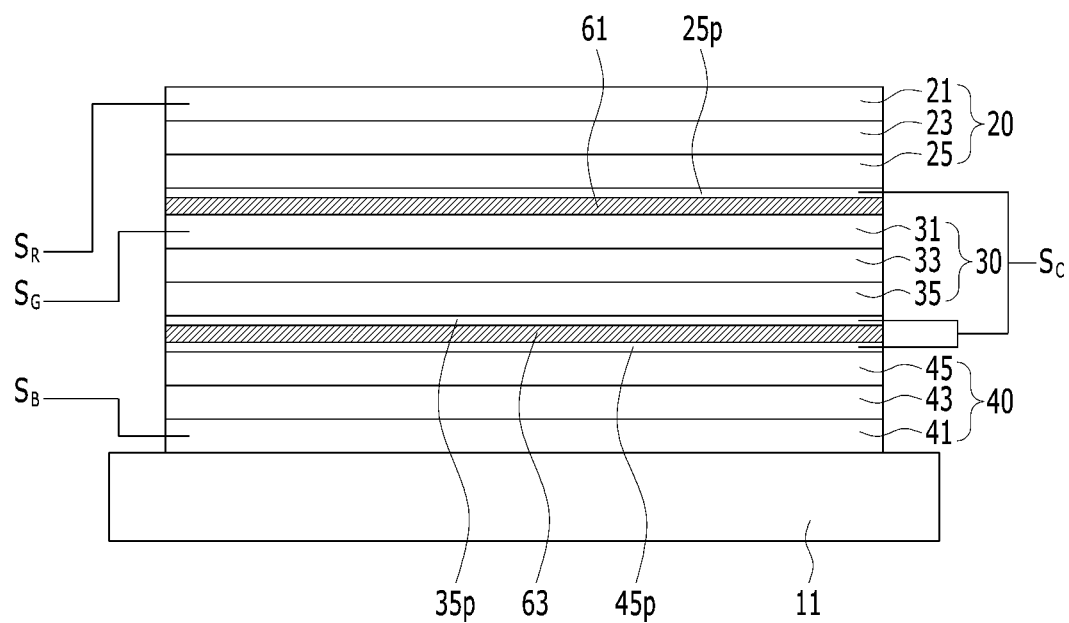
FIG. 3 is a schematic cross-sectional view of a light emitting stacked structure constructed according to an exemplary embodiment.

In addition, when the light emitting chip 100 including the light emitting stacked structure is mounted to another substrate to manufacture a display device, for example, the number of chips to be mounted may be significantly reduced as compared to the conventional light emitting devices due to its stacked structure. As such, manufacture of the display device that employs the light emitting stacked structure may be substantially simplified, especially when hundreds of thousands or millions of pixels are formed in one display device. The light emitting chip 100 may include a light emitting stacked structure as shown in FIG. 3, which includes three light emitting stacks and a plurality of connection electrodes connected to the light emitting stacks, which will be described in more detail below.

According to an exemplary embodiment, the passivation layer 90 may be formed around the light emitting stacked structure. More particularly, as shown in FIG. 1, the passivation layer 90 may be formed between connection electrodes of the light emitting stacked structure. According to the illustrated exemplary embodiment, the passivation layer 90 may be formed to be substantially flush with top surfaces of the connection electrodes, and may include an epoxy molding compound (EMC), which may be formed to have various colors, such as black or transparent, without being limited thereto. However, the inventive concepts are not limited thereto. For example, in some exemplary embodiments, the passivation layer 90 may include a polyimide (PID), and in this case, the PID may be provided as a dry film rather than a liquid type to increase the level of flatness when applied to the light emitting stacked structure. In some exemplary embodiments, the passivation layer 90 may include a material that has photosensitivity. In this manner, the passivation layer 90 may protect the light emitting structure from an external impact that may be applied during subsequent processes, as well as providing a sufficient contact area to the light emitting chip 100 to facilitate its handling during subsequent transferring steps. In addition, the passivation layer 90 may prevent leakage of light towards a side surface of the light emitting chip 100, so as to prevent or at least suppress interference of light emitted from adjacent light emitting chips 100.

The molding layer 91 may surround at least the sides of the light emitting chip 100 to protect the light emitting chip 100 from external impact. According to the illustrated exemplary embodiment, the molding layer 91 may expose at least one surface of the light emitting chip 100 to increase light efficacy and color purity. In this case, since the substrate on which the light emitting stacked structure was grown has been removed from in the illustrated exemplary embodiment, light emitted from the light emitting package 110 may have increased brightness and purity. According to an exemplary embodiment, the molding layer 91 may include organic or inorganic polymer. In some exemplary embodiments, the molding layer 91 may include substantially the same material as the passivation layer 90. However, the inventive concepts are not limited thereto, and in some exemplary embodiments, the molding layer 91 and the passivation layer 90 may include materials different from each other.

The circuit board 11p may include lower circuit electrodes 11pa, middle circuit electrodes 11pb, and upper circuit electrodes 11pc connected to each other. The upper circuit electrodes 11pc may be spaced apart from each other at a predetermined pitch P. For example, the pitch (or a distance) between the upper circuit electrodes 11pc may correspond to that of electrodes of a target substrate, such as a display device. In this manner, the light emitting package 110 according to an exemplary embodiment may be mounted on a conventional display device, without changing the configuration of the target substrate of the display device.

Figure 2:
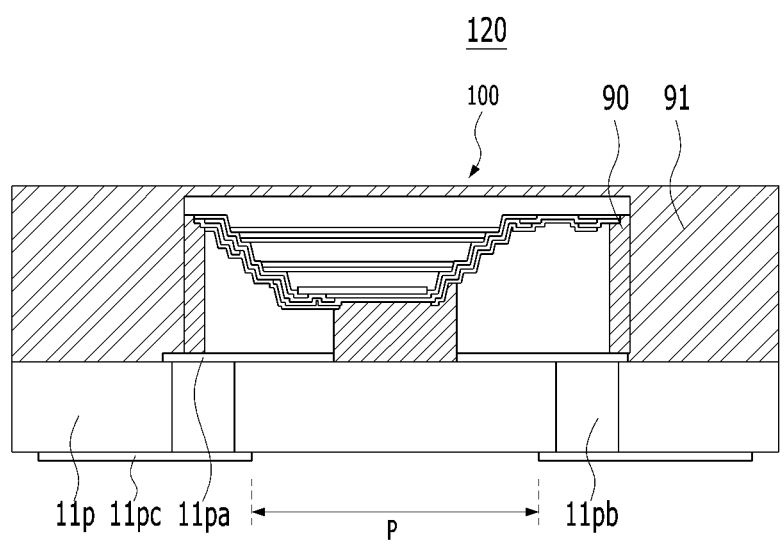
FIG. 2 is a schematic cross-sectional view of a light emitting package constructed according to another exemplary embodiment of the invention.

FIG. 2 is a schematic cross-sectional view of a light emitting package according to another exemplary embodiment.

Referring to FIG. 2, a light emitting package 120 according to the illustrated exemplary embodiment is substantially the same as the light emitting package 110 of FIG. 1, except for the shape of the molding layer 91. More particularly, the molding layer 91 according to the illustrated exemplary embodiment covers a top surface of the light emitting chip 100. In this manner, the molding layer 91 may protect the light emitting chip 100 from external impact or external particles, such as dust and moisture, from infiltrating into the light emitting stacked structure, and may also prevent external light from being reflected by the substrate 11 towards a user. In addition, when the molding layer 91 covers the top surface of the light emitting chip 100 as shown in FIG. 2, the transmittance of light may be controlled by adjusting the thickness of the molding layer 91 or by forming the molding layer 91 with a material that provides a desired light transmittance. Since the light emitting package 120 is substantially the same as the light emitting package 110 of FIG. 1 except for the shape of the molding layer 91, repeated descriptions of the constituent elements thereof will be omitted to avoid redundancy.

FIG. 3 is a schematic cross-sectional view of a light emitting stacked structure constructed according to an exemplary embodiment.

Referring to FIG. 3, the light emitting stacked structure according to the illustrated exemplary embodiment includes a first LED sub-unit, a second LED sub-unit, and a third LED sub-unit disposed on a substrate 11. The first LED sub-unit may include a first light emitting stack 20, the second LED sub-unit may include a second light emitting stack 30, and the third LED sub-unit may include a third light emitting stack 40. While the drawings show the light emitting stacked structure including three light emitting stacks 20, 30, and 40, the inventive concepts are not limited to a particular number of light emitting stacks formed in the light emitting stacked structure. For example, in some exemplary embodiments, the light emitting stacked structure may include two or more light emitting stacks therein. Hereinafter, the light emitting stacked structure will be described with reference to one that includes three light emitting stacks 20, 30, and 40 according to an exemplary embodiment.

The substrate 11 may include a light transmitting insulating material to transmit light therethrough. In some exemplary embodiments, however, the substrate 11 may be formed to be semi-transparent to transmit only light having a specific wavelength, or formed to be partially transparent to transmit only a portion of light having the specific wavelength. The substrate 11 may be a growth substrate capable of epitaxially growing the third light emitting stack 40 thereon, such as a sapphire substrate. However, the inventive concepts are not limited thereto, and in some exemplary embodiments, the substrate 11 may include various other transparent insulating materials. For example, the substrate 11 may include a glass, a quartz, a silicon, an organic polymer, or an organic-inorganic composite material, such as silicon carbide (SiC), gallium nitride (GaN), indium gallium nitride (InGaN), aluminum gallium nitride (AlGaN), aluminum nitride (AlN), gallium oxide ($Ga_2O_3$), or silicon substrate. As another example, the substrate 11 in some exemplary embodiments may be a printed circuit board or a composite substrate including electrical lines therein for providing light emitting signals and a common voltage to each of the light emitting stacks formed thereon.

Each of the first, second, and third light emitting stacks 20, 30, and 40 is configured to emit light towards the substrate 11. As such, light emitted from the first light emitting stack 20, for example, may pass through the second and third light emitting stacks 30 and 40. According to an exemplary embodiment, light emitted from each of the first, second, and third light emitting stacks 20, 30, and 40 may have different wavelength bands from each other, and the light emitting stack that is disposed further away from the substrate 11 may emit light having a longer wavelength band. For example, the first, second, and third light emitting stacks 20, 30, and 40 may emit red light, green light, and blue light, respectively. However, the inventive concepts are not limited thereto. As another example, the first, second, and third light emitting stacks 20, 30, and 40 may emit red light, blue light, and green light, respectively. In another aspect, when the substrate 11 is removed from the light emitting chip 100 as shown in FIG. 1, the first, second, and third light emitting stacks 20, 30, and 40 of the light emitting stacked structure can be considered being sequentially disposed on the circuit board 11p shown in FIG. 1. In this case, the first, second, and third light emitting stacks 20, 30, and 40 may emit green light, blue light, and red light, respectively. As still another example, one or more of the light emitting stacks may emit light having substantially the same wavelength band. As still another example, when the light emitting stacked structure includes a micro-LED, which has a surface area less than about 10,000 square $\mu$m as known in the art, or less than about 4,000 square $\mu$m or 2,500 square $\mu$m in other exemplary embodiments, a light emitting stack that is disposed further away from the substrate 11 may emit light having a shorter wavelength band than light emitted from the one disposed closer to the substrate 11, without adversely affecting operation, due to the small form factor of a micro-LED. In this case, the micro-LED may be operated with low operating voltage, and thus, a separate color filter may not be required between the light emitting stacks. Hereinafter, the first, second, and third light emitting stacks 20, 30, and 40 will be exemplarily described as emitting red light, green light, and blue light, respectively, according to an exemplary embodiment.

The first light emitting stack 20 includes a first-type semiconductor layer 21, an active layer 23, and a second-type semiconductor layer 25. According to an exemplary embodiment, the first light emitting stack 20 may include a semiconductor material that emits red light, such as aluminum gallium arsenide (AlGaAs), gallium arsenide phosphide (GaAsP), aluminum gallium indium phosphide (AlGaInP), and gallium phosphide (GaP), without being limited thereto. A first lower contact electrode 25p may be disposed under the second-type semiconductor layer 25 of the first light emitting stack 20.

The second light emitting stack 30 includes a first-type semiconductor layer 31, an active layer 33, and a second-type semiconductor layer 35. According to an exemplary embodiment, the second light emitting stack 30 may include a semiconductor material that emits green light, such as indium gallium nitride (InGaN), gallium nitride (GaN), gallium phosphide (GaP), aluminum gallium indium phosphide (AlGaInP), and aluminum gallium phosphide (AlGaP), without being limited thereto. A second lower contact electrode 35p is disposed under the second-type semiconductor layer 35 of the second light emitting stack 30.

The third light emitting stack 40 includes a first-type semiconductor layer 41, an active layer 43, and a second-type semiconductor layer 45. According to an exemplary embodiment, the third light emitting stack 40 may include a semiconductor material that emits blue light, such as gallium nitride (GaN), indium gallium nitride (InGaN), and zinc selenide (ZnSe), without being limited thereto. A third lower contact electrode 45p is disposed on the second-type semiconductor layer 45 of the third light emitting stack 40.

According to an exemplary embodiment, each of the first-type semiconductor layers 21, 31, and 41 and each of the second-type semiconductor layers 25, 35, and 45 of the first, second, and third light emitting stacks 20, 30, and 40 may have a single-layer structure or a multi-layered structure, and in some exemplary embodiments, may include a superlattice layer. In addition, the active layers 23, 33, and 43 of the first, second, and third light emitting stacks 20, 30, and 40 may have a single quantum well structure or a multiple quantum well structure.

Each of the first, second, and third lower contact electrodes 25p, 35p, and 45p may include a transparent conductive material to transmit light. For example, the lower contact electrodes 25p, 35p, and 45p may include a transparent conductive oxide (TCO), such as tin oxide (SnO), indium oxide ($InO_2$), zinc oxide (ZnO), indium tin oxide (ITO), and indium tin zinc oxide (ITZO), without being limited thereto.

A first adhesive layer 61 is disposed between the first light emitting stack 20 and the second light emitting stack 30, and a second adhesive layer 63 is disposed between the second light emitting stack 30 and the third light emitting stack 40. The first and second adhesive layers 61 and 63 may include a non-conductive material that transmits light. For example, the first and second adhesive layers 61 and 63 may each include an optical clear adhesive (OCA), which may include epoxy, polyimide, SU8, spin-on glass (SOG), benzocyclobutene (BCB), or others, without being limited thereto.

According to an exemplary embodiment, each of the first, second, and third light emitting stacks 20, 30, and 40 may be driven independently. More particularly, one of the first and second-type semiconductor layers of each light emitting stack may be applied with a common voltage Sc, and the other one of the first and second-type semiconductor layers of each light emitting stack may be applied with a respective light emitting signal $S_R$, $S_G$, and SB. For example, according to the illustrated exemplary embodiment, the first-type semiconductor layers 21, 31, and 41 of each light emitting stack may be an n-type, and the second-type semiconductor layers 25, 35, and 45 of each light emitting stack may be a p-type. In this case, the third light emitting stack 40 may have a reversed stacked sequence as compared to the first and second light emitting stacks 20 and 30, such that the p-type semiconductor layer 45 is disposed on top of the active layer 43 to simplify the manufacturing process. Hereinafter, the first-type and second-type semiconductor layers may be interchangeably be referred to as p-type and n-type, respectively, according to the illustrated exemplary embodiment.

While the light emitting stacked structure according to the illustrated exemplary embodiment has a common p-type structure, however, the inventive concepts are not limited thereto. For example, in some exemplary embodiments, the first-type semiconductor layers 21, 31, and 41 of each light emitting stack may be a p-type, and the second-type semiconductor layers 25, 35, and 45 of each light emitting stack may be an n-type to form a common n-type light emitting stacked structure. Furthermore, in some exemplary embodiments, the stacked sequence of each light emitting stack may be variously modified without being limited to that shown in the drawings. Hereinafter, the light emitting stacked structure according to the illustrated exemplary embodiment will be described with reference to the common p-type light emitting stacked structure.

According to an exemplary embodiment, the light emitting stacked structure may further include various additional components to improve the purity and efficiency of light emitted therefrom. For example, in some exemplary embodiments, a wavelength pass filter may be formed between adjacent light emitting stacks to prevent or at least suppress light having a shorter wavelength from traveling towards a light emitting stack emitting a longer wavelength. In addition, in some exemplary embodiments, concave-convex portions may be formed on a light emitting surface of at least one of the light emitting stacks to balance the brightness of light between the light emitting stacks. For example, as green light generally has a higher visibility than red light and blue light, in some exemplary embodiments, the concave-convex portions may be formed on the light emitting stacks emitting red light or blue light to improve light efficiency thereof, thereby balancing the visibility between light emitted from the light emitting stacks.

Hereinafter, a method of forming a light emitting chip will be described with reference to the drawings according to an exemplary embodiment.

FIGS. 4A, 5A, 6A, 7A, 8A, and 9A are plan views illustrating a process of manufacturing a light emitting chip according to an exemplary embodiment. FIGS. 4B, 5B, 6B, 7B, 8B, and 9B are cross-sectional views taken along line A-A' of its corresponding plan view shown in FIGS. 4A, 5A, 6A, 7A, 8A, and 9A according to an exemplary embodiment.

Referring back to FIG. 3, the first-type semiconductor layer 41, the third active layer 43, and the second-type semiconductor layer 45 of the third light emitting stack 40 may be sequentially grown on the substrate 11 by a metal organic chemical vapor deposition (MOCVD) method or a molecular beam epitaxy (MBE) method, for example. The third lower contact electrode 45p may be formed on the third p-type semiconductor layer 45 by a physical vapor deposition method or a chemical vapor deposition method, for example, and may include a transparent conductive oxide (TCO). When the third light emitting stack 40 emits blue light according to an exemplary embodiment, the substrate 11 may include $Al_2O_3$ (e.g., sapphire substrate), and the third lower contact electrode 45p may include a transparent conductive oxide TCO, such as tin oxide (SnO), indium oxide ($InO_2$), zinc oxide (ZnO), indium tin oxide (ITO), indium tin zinc oxide (ITZO) or the like, without being limited thereto. The first and second light emitting stacks 20 and 30 may be similarly formed by sequentially growing the first-type semiconductor layer, the active layer, and the second-type semiconductor layer on a temporary substrate, respectively, and the lower contact electrode including a transparent conductive oxide may be respectively formed on the second-type semiconductor layer by physical vapor deposition method or a chemical vapor deposition method or the like, for example.

According to an exemplary embodiment, the first and second light emitting stacks 20 and 30 may be adjoined to each other with the first adhesive layer 61 interposed therebetween, and at least one of the temporary substrates of the first and second light emitting stacks 20 and 30 may be removed by a laser lift off process, chemical process, mechanical process, or the like, for example. In this case, in some exemplary embodiments, concave-convex portions may be formed on the exposed light emitting stack to improve light extraction efficiency. Then, the first and second light emitting stacks 20 and 30 may be adjoined with the third light emitting stack 40 with the second adhesive layer 63 interposed therebetween, and the remaining one of the temporary substrates of the first and second light emitting stacks 20 and 30 may be removed by a laser lift off process, chemical process, mechanical process, or the like, for example. In this case, in some exemplary embodiments, concave-convex portions may be formed on the remaining exposed light emitting stack to improve light extraction efficiency.

In another exemplary embodiment, the second adhesive layer 63 may be formed on the third light emitting stack 40. Then, the second light emitting stack 30 may be adjoined to the third light emitting stack 40 with the second adhesive layer 63 interposed between, and the temporary substrate of the second light emitting stack 30 may be removed by a laser lift off process, chemical process, mechanical process, or the like. Then, the first adhesive layer 61 may be formed on the second light emitting stack 30. The first light emitting stack 20 may then be adjoined to the second light emitting stack 30 with the first adhesive layer 61 interposed therebetween. Once the first light emitting stack 20 is coupled to the second light emitting stack 30 that is coupled to the third light emitting stack 40, the temporary substrate of the first light emitting stack 20 may be removed by a laser lift off process, chemical process, mechanical process, or the like.

Figure 4A:
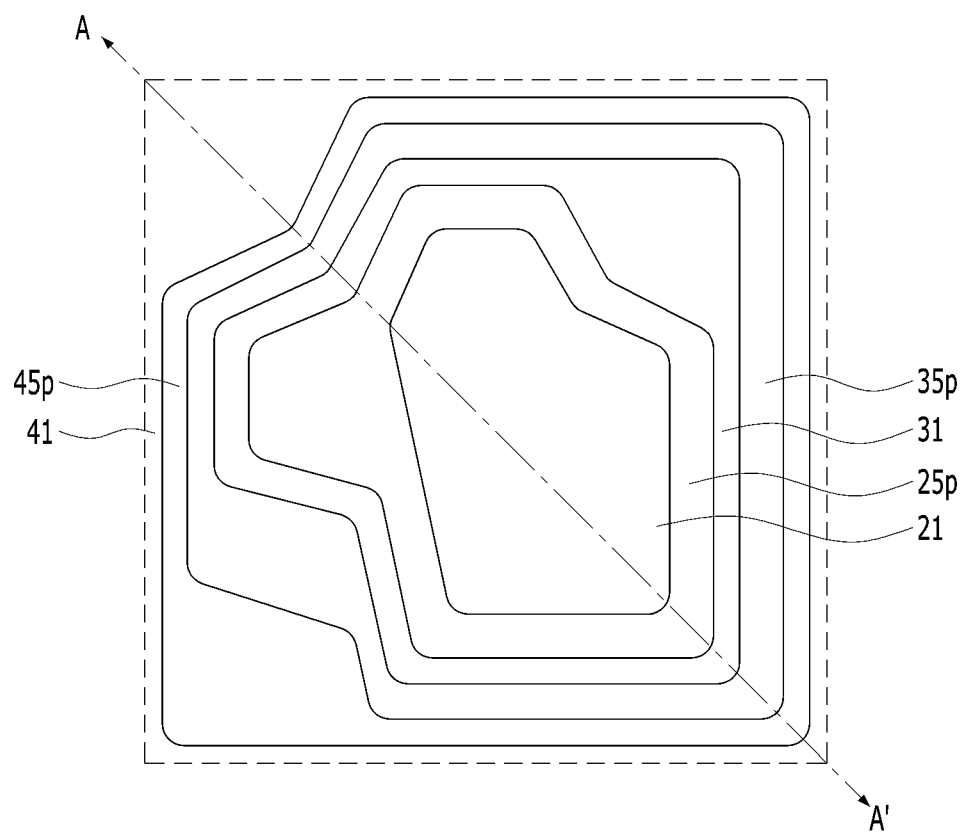
FIGS. 4A, 5A, 6A, 7A, 8A, and 9A are plan views illustrating a process of manufacturing a light emitting chip according to an exemplary embodiment.
Figure 4B:
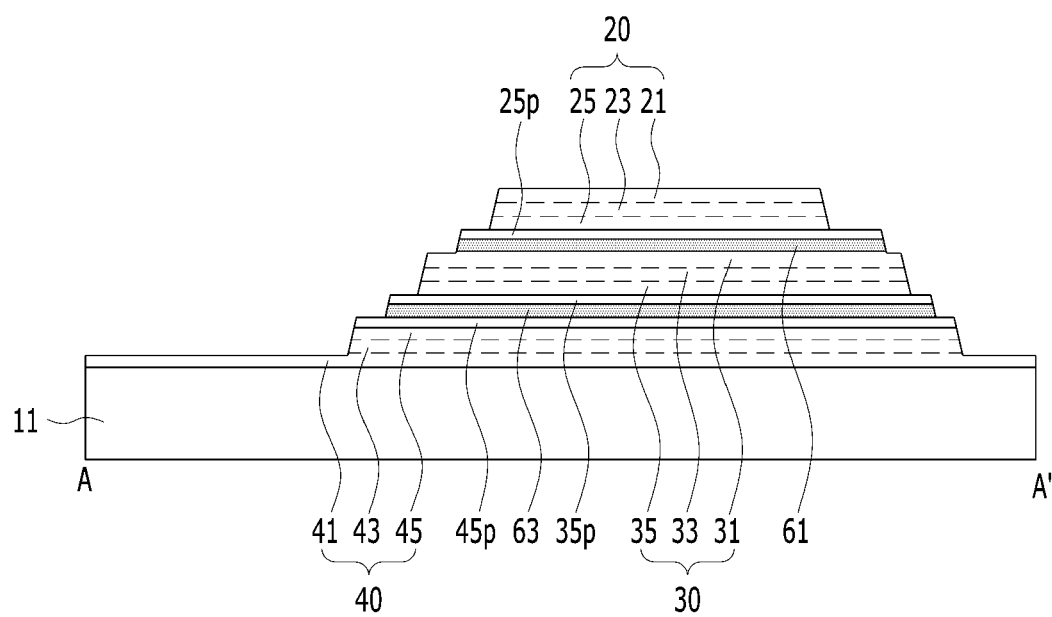
FIGS. 4B, 5B, 6B, 7B, 8B, and 9B are cross-sectional views taken along line A-A' of its corresponding plan view shown in FIGS. 4A, 5A, 6A, 7A, 8A, and 9A according to an exemplary embodiment.

Referring to FIGS. 4A and 4B, various portions of each of the first, second, and third light emitting stacks 20, 30, and 40 may be patterned via etching process or the like to expose portions of the first-type semiconductor layer 21, first lower contact electrode 25p, first-type semiconductor layer 31, second lower contact electrode 35p, third lower contact electrode 45p, and first-type semiconductor layer 41. According to the illustrated exemplary embodiment, the first light emitting stack 20 has the smallest area among the light emitting stacks 20, 30, and 40. However, the inventive concepts are not limited to relative sizes of the light emitting stacks 20, 30, and 40.

Figure 5A:
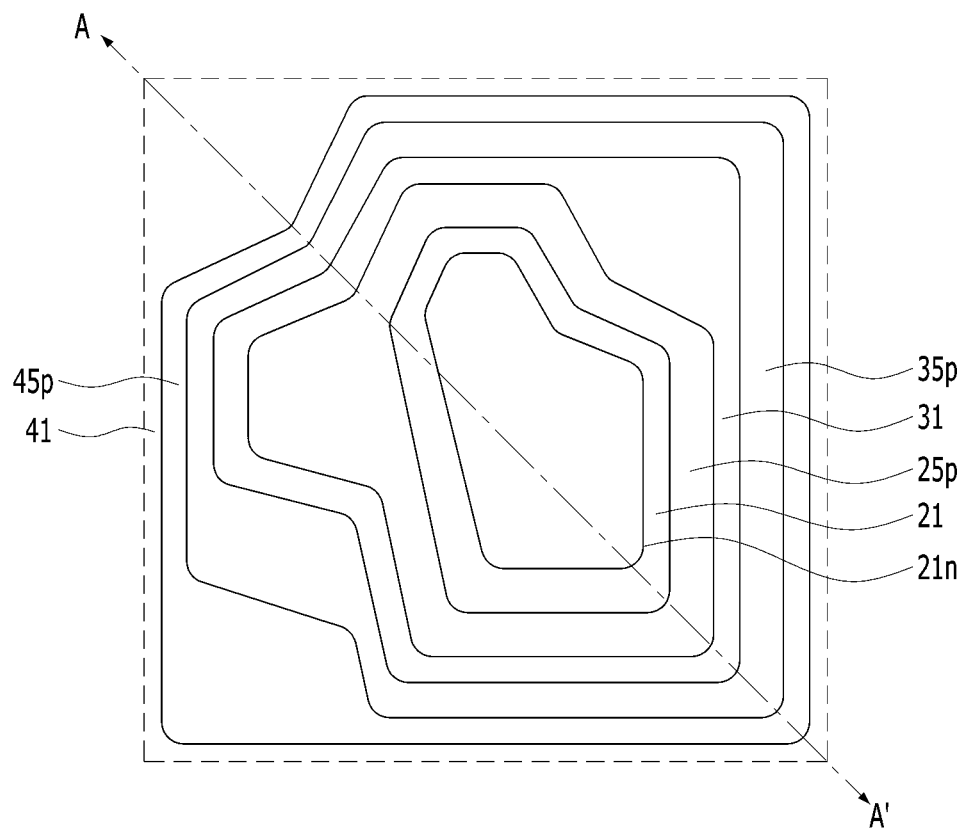
Figure 5B:
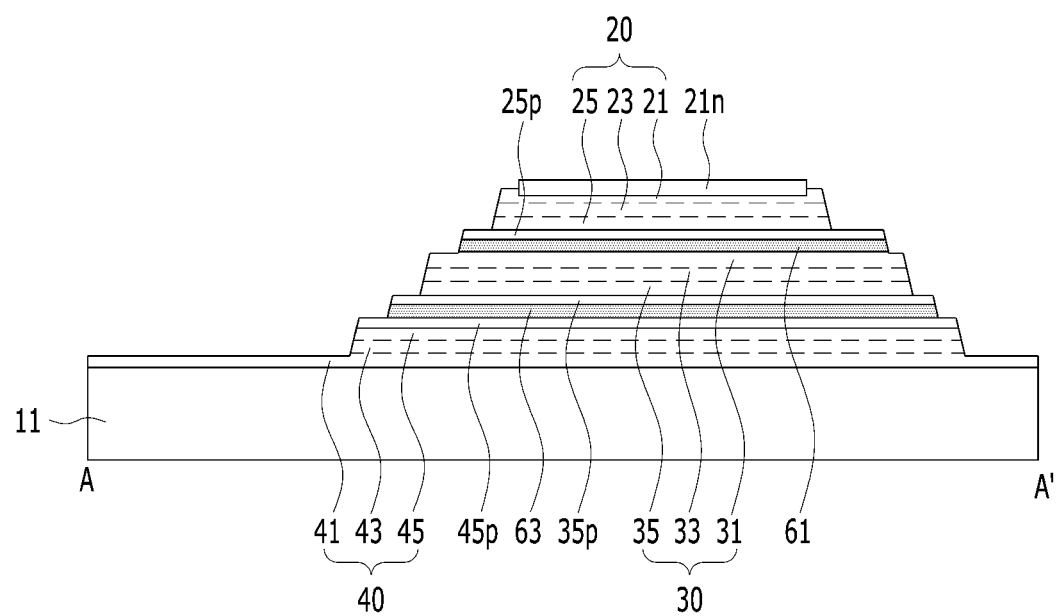

Referring to FIGS. 5A and 5B, a portion of a top surface of the first-type semiconductor layer 21 of the first light emitting stack 20 may be patterned, such as via wet-etching, at which a first upper contact electrode 21n may be formed. In this manner, the level of ohmic contact may be increased between the first-type semiconductor layer 21 and the first upper contact electrode 21n. The first upper contact electrode 21n may have a single-layer structure or a multi-layered structure, and may include Al, Ti, Cr, Ni, Au, Ag, Sn, W, Cu, or an alloy thereof, such as Au—Te alloy or an Au—Ge alloy, without being limited thereto. In an exemplary embodiment, the first upper contact electrode 21n may have a thickness of about 100 nm, and include metal having high reflectance to increase light emission efficiency in a downward direction towards the substrate 11.

Figure 6A:
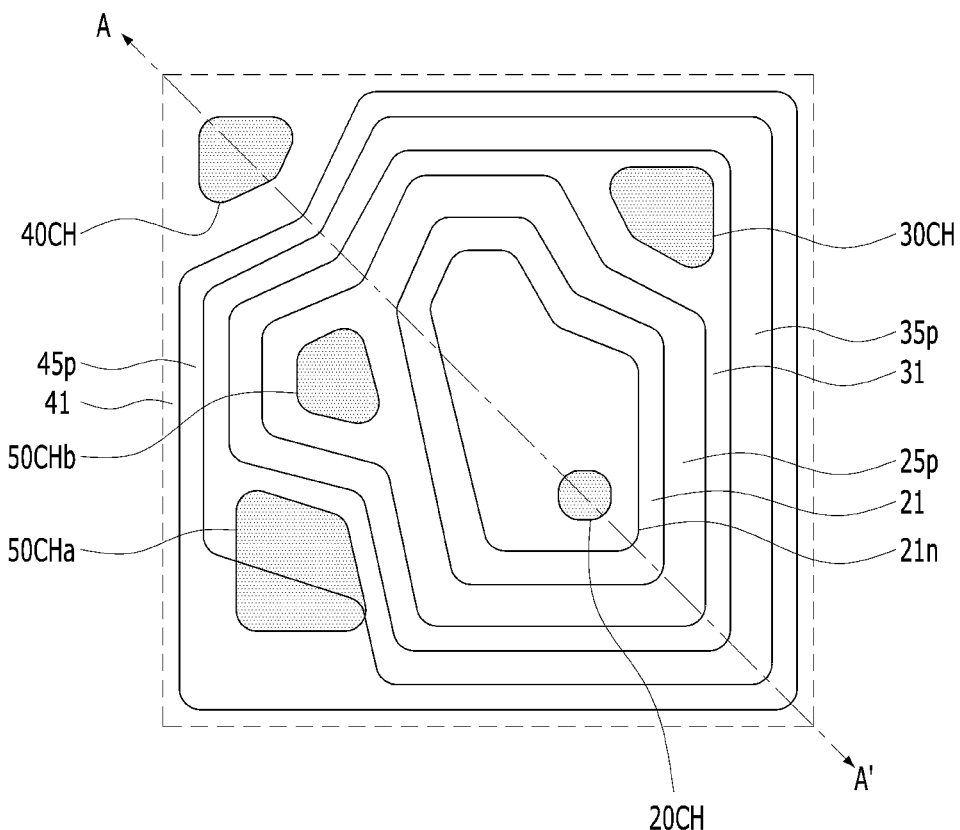
Figure 6B:
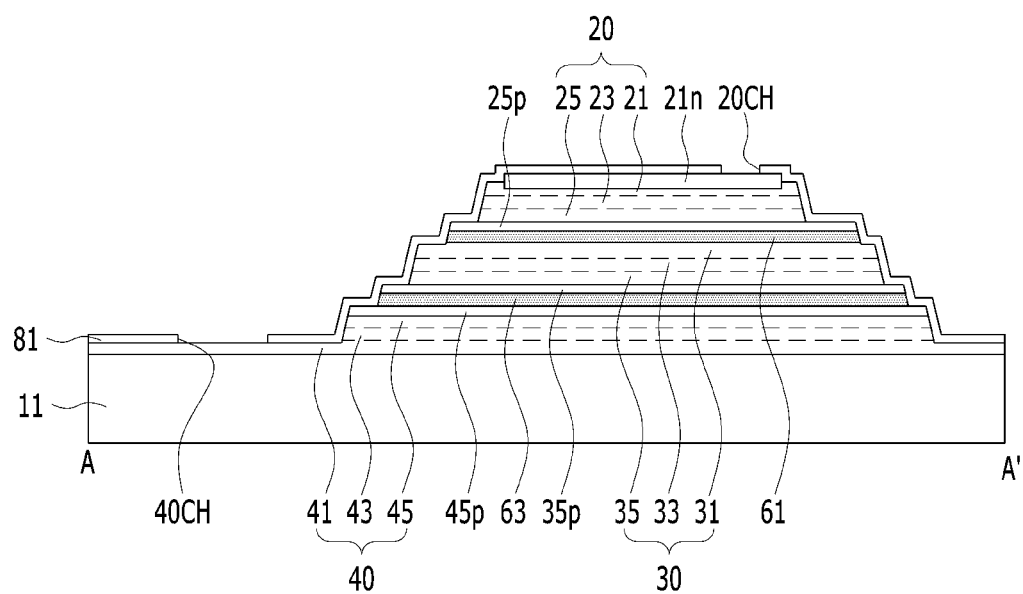

Referring to FIGS. 6A and 6B, a first insulating layer 81 may be disposed on at least a portion of side surfaces of the first, second, and third light emitting stacks 20, 30, and 40. The first insulating layer 81 may include various organic or inorganic insulating materials, such as polyimide, $SiO_2$, $SiN_x$, $Al_2O_3$ or the like. For example, the first insulating layer 81 may include a distributed Bragg reflector (DBR). As another example, the first insulating layer 81 may include a black-colored organic polymer. In some exemplary embodiments, a metal reflection layer that is electrically floated may be further disposed on the first insulating layer 81 to reflect light emitted from the light emitting stacks 20, 30, and 40 towards the substrate 11. In some exemplary embodiments, the first insulating layer 81 may have a single-layered or a multi-layered structure formed of two or more insulating layers having different refractive indices from each other.

According to an exemplary embodiment, portions of the first insulating layer 81 may be removed to form first, second, third, and fourth contact holes 20CH, 30CH, 40CH, and 50CH. The first contact hole 20CH is defined on the first n-type contact electrode 21n to expose a portion of the first n-type contact electrode 21n. The second contact hole 30CH may expose a portion of the first-type semiconductor layer 31 of the second light emitting stack 30. The third contact hole 40CH may expose a portion of the first-type semiconductor layer 41 of the third light emitting stack 40. The fourth contact hole 50CH may expose portions of the first, second, and third lower contact electrodes 21p, 31p, and 41p. The fourth contact hole 50CH may include the first sub-contact hole 50CHa exposing a portion of the first lower contact electrode 25p and the second sub-contact hole 50CHb exposing the second and third lower contact electrodes 35p and 45p. In some exemplary embodiments, however, a single first sub-contact hole CH may expose each of the first, second, and third lower contact electrodes 21p, 31p, and 41p.

Figure 7A:
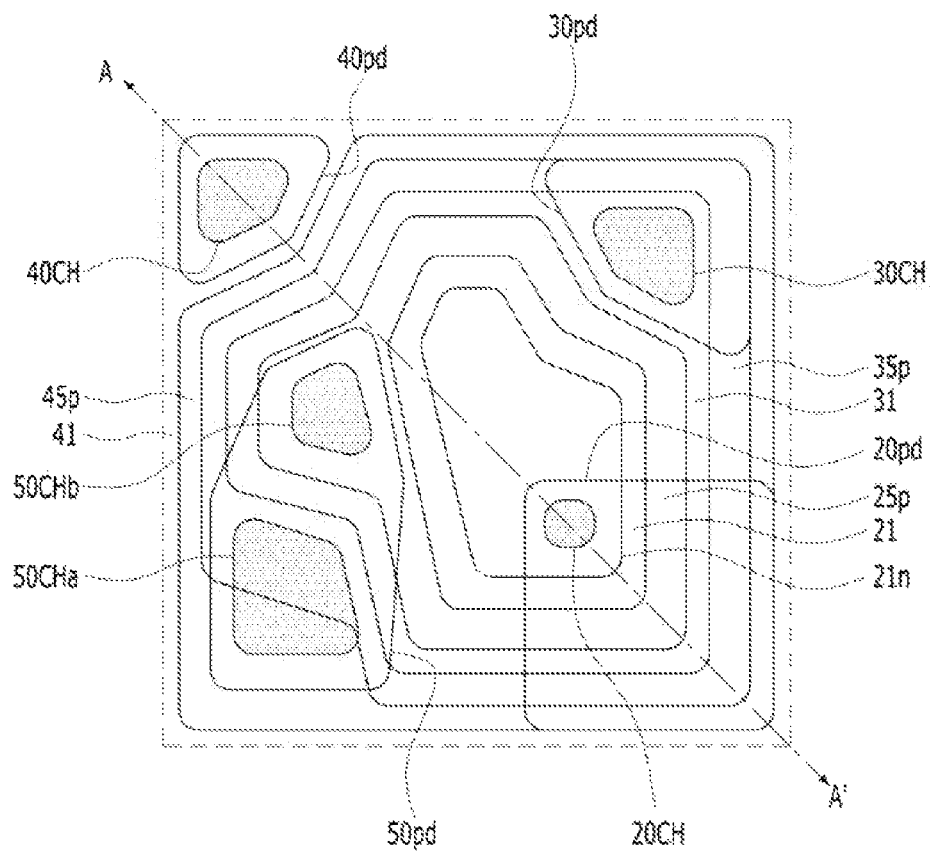
Figure 7B:
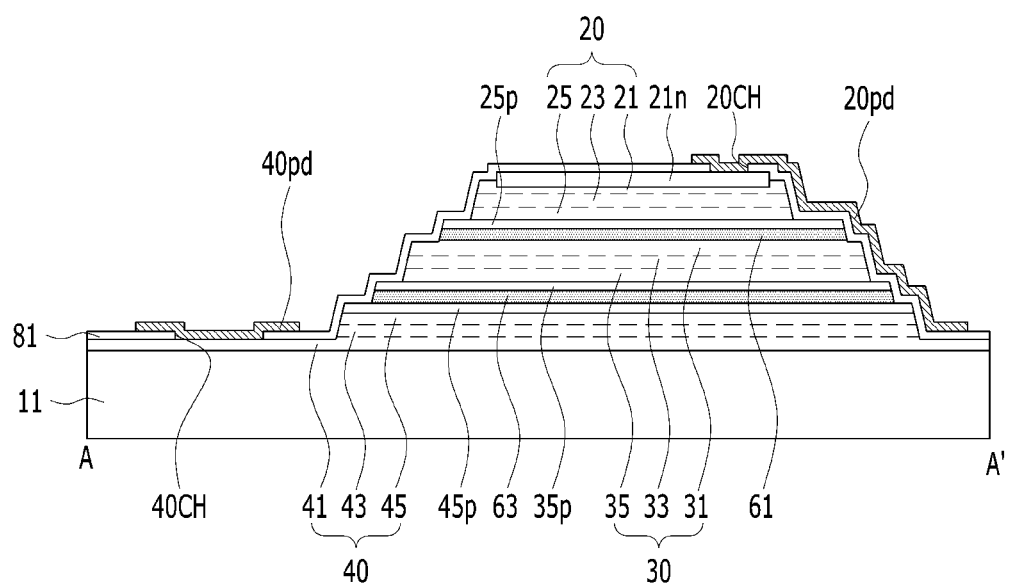

Referring to FIGS. 7A and 7B, first, second, third, and fourth pads 20pd, 30pd, 40pd, and 50pd are formed on the first insulating layer 81 formed with the first, second, third, and fourth contact holes 20CH, 30CH, 40CH, and 50CH. The first, second, third, and fourth pads 20pd, 30pd, 40pd, and 50pd may be formed by, for example, forming a conductive layer on substantially the entire surface of the substrate 11, and patterning the conductive layer using a photolithography process or the like.

The first pad 20pd is formed to overlap an area where the first contact hole 20CH is formed, such that the first pad 20pd may be connected to the first upper contact electrode 21n of the first light emitting stack 20 through the first contact hole 20CH. The second pad 30pd is formed to overlap an area where the second contact hole 30CH is formed, such that the second pad 30pd may be connected to the first-type semiconductor layer 31 of the second light emitting stack 30 through the second contact hole 30CH. The third pad 40pd is formed to overlap an area where the third contact hole 40CH is formed, such that the third pad 40pd may be connected to the first-type semiconductor layer 41 of the third light emitting stack 40 through the third contact hole 40CH. The fourth pad 50pd is formed to overlap with an area where the fourth contact hole 50CH is formed, more particularly, where the first and second sub-contact holes 50CHa and 50CHb are formed, such that the fourth pad 50pd may be connected to the first, second, and third lower contact electrodes 25p, 35p, and 45p of the first, second, and third light emitting stacks 20, 30, and 40 through the first and second sub-contact holes 50CHa and 50CHb.

Figure 8A:
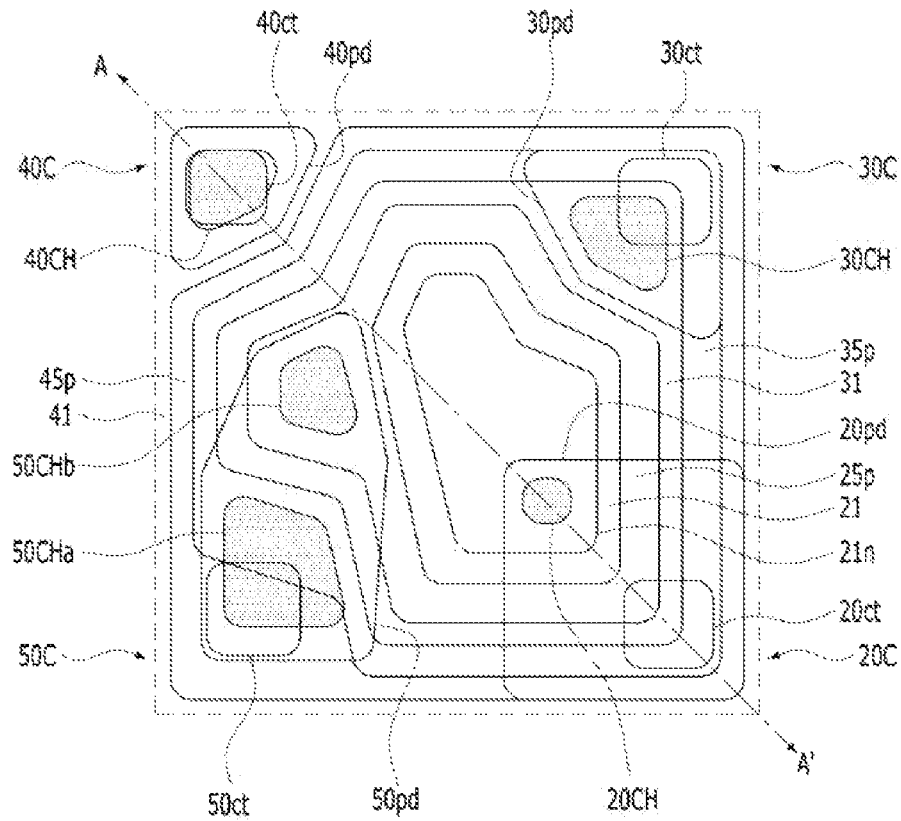
Figure 8B:
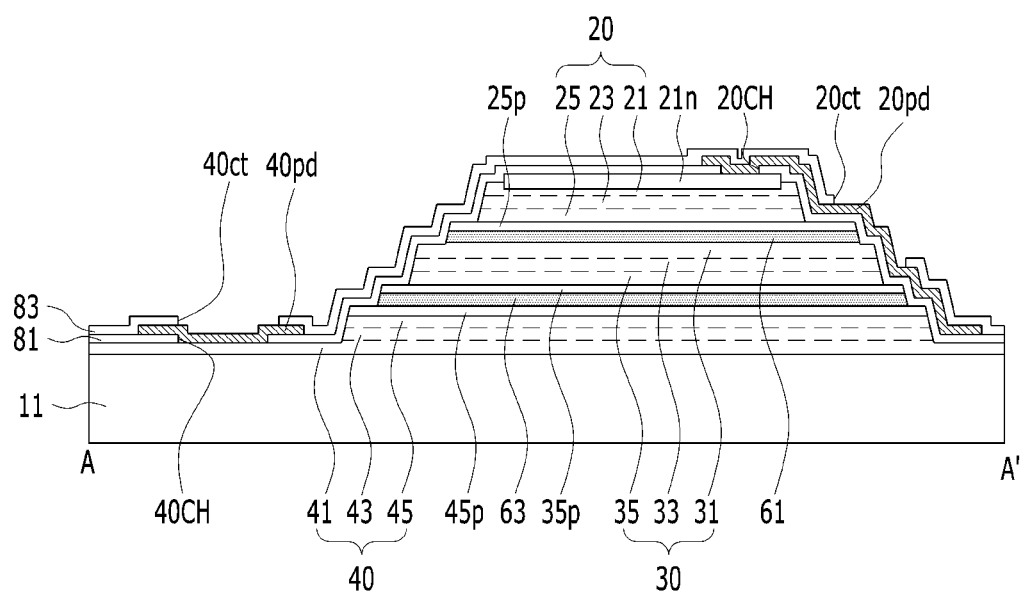

Referring to FIGS. 8A and 8B, a second insulating layer 83 may be formed on the first insulating layer 81. The second insulating layer 83 may include various organic or inorganic insulating materials, such as polyimide, $SiO_2$, $SiN_x$, $Al_2O_3$ or the like. For example, the second insulating layer 83 may include a distributed Bragg reflector (DBR). As another example, the second insulating layer 83 may include a black-colored organic polymer. In some exemplary embodiments, a metal reflection layer that is electrically floated may be further disposed on the second insulating layer 83 to reflect light emitted from the light emitting stacks 20, 30, and 40 towards the substrate 11. In some exemplary embodiments, the second insulating layer 83 may have a single-layered or a multi-layered structure formed of two or more insulating layers having different refractive indices from each other. The second insulating layer 83 is then patterned and to form first, second, third, and fourth through holes 20ct, 30ct, 40ct, and 50ct therein.

The first through hole 20ct formed on the first pad 20pd exposes a portion of the first pad 20pd. The second through hole 30ct formed on the second pad 30pd exposes a portion of the second pad 30pd. The third through hole 40ct formed on the third pad 40pd exposes a portion of the third pad 40pd. The fourth through hole 50ct formed on the fourth pad 50pd exposes a portion of the fourth pad 50pd. In the illustrated exemplary embodiment, the first, second, third, and fourth through holes 20ct, 30ct, 40ct, and 50ct may be respectively defined in areas where the first, second, third, and fourth pads 20pd, 30pd, 40pd, and 50pd are formed.

Figure 9A:
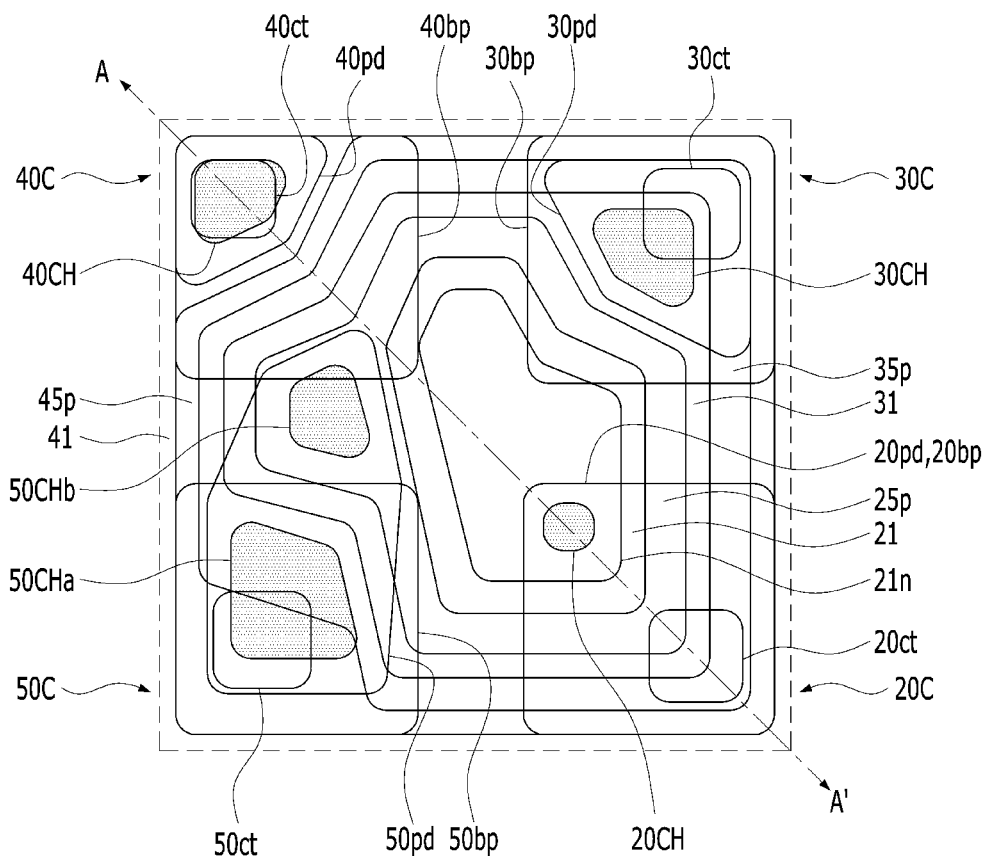
Figure 9B:
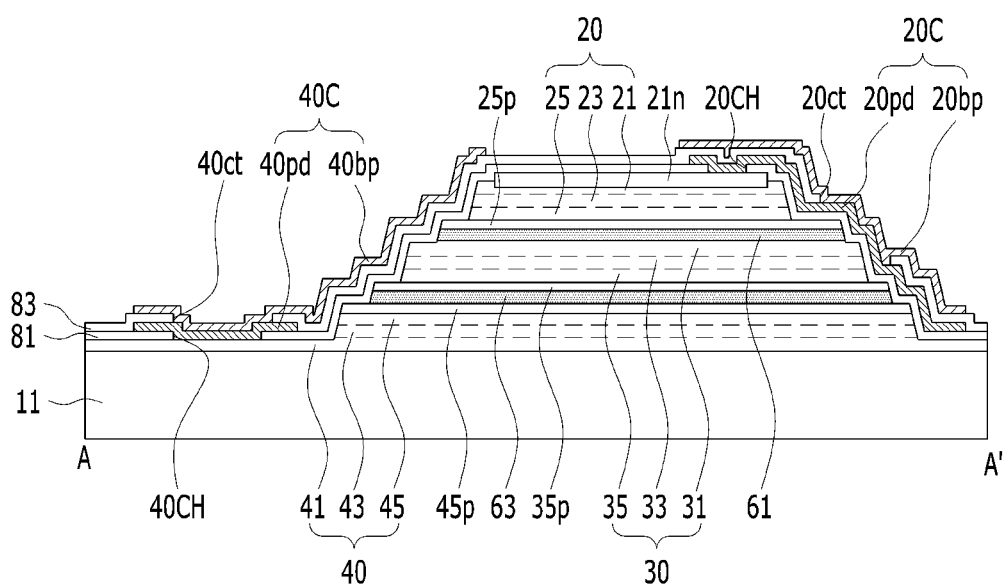

Referring to FIGS. 9A and 9B, first, second, third, and fourth bump electrodes 20bp, 30bp, 40bp, and 50bp are formed on the second insulating layer 83 formed with the first, second, third, and fourth through holes 20ct, 30ct, 40ct, and 50ct. The first bump electrode 20bp is formed to overlap an area where the first through hole 20ct is formed, such that the first bump electrode 20bp may be connected to the first pad 20pd through the first through hole 20ct. The second bump electrode 30bp is formed to overlap an area where the second through hole 30ct is formed, such that the second bump electrode 30bp may be connected to the second pad 30pd through the second through hole 30ct. The third bump electrode 40bp is formed to overlap an area where the third through hole 40ct is formed, such that the third bump electrode 40bp may be connected to the third pad 40pd through the third through hole 40ct.

The fourth bump electrode 50bp is formed to overlap with an area where the fourth through hole 50ct is formed, such that the fourth bump electrode 50bp is connected to the fourth pad 50pd through the fourth through hole 50ct. More particularly, the fourth pad 50pd is connected to the second-type semiconductor layers 25, 35, and 45 of the first, second, and third light emitting stacks 20, 30, and 40 through a first sub-contact hole 50CHa and a second sub-contact hole 50CHb defined on the first, second, and third lower contact electrodes 25p, 35p, and 45p of the first, second, and third light emitting stacks 20, 30, and 40. In particular, the fourth pad 50pd is connected to the first lower contact electrode 25p through the second sub-contact hole 50CHb, and is connected to the second and third lower contact electrodes 35p and 45p through the first sub-contact hole 50CHa. In this manner, since the fourth pad 50pd can be connected to the second and third lower contact electrodes 35p and 45p through a single first sub-contact hole 50CHa, a manufacturing process of the light emitting chip 100 may be simplified, and an area occupied by the contact holes in the light emitting chip 100 may be reduced. At least a portion of the fourth bump electrode 50bp may overlap with the fourth pad 50pd. The fourth bump electrode 50bp is connected to the fourth pad 50pd through a fourth through hole 50ct with the second insulating layer 83 interposed therebetween in an overlapping area between the fourth bump electrode 50bp and the fourth pad 50pd.

The first, second, third, and fourth bump electrodes 20bp, 30bp, 40bp, and 50bp may be formed by depositing a conductive layer on the substrate 11, and patterning the conductive layer, for example, which may include at least one of Ni, Ag, Au, Pt, Ti, Al, Cr, W, TiW, Mo, Cu, TiCu, or the like. Hereinafter, the first pad 20pd and the first bump electrode 20bp may be collectively be referred to as a first contact part 20C, the second pad 30pd and the second bump electrode 30bp may be collectively be referred to as a second contact part 30C, the third pad 40pd and the third bump electrode 40bp may be collectively be referred to as a third contact part 40C, and the fourth pad 50pd and the fourth bump electrode 50bp may be collectively be referred to as a fourth contact part 50C.

According to an exemplary embodiment, the first, second, third, and fourth contact parts 20C, 30C, 40C, and 50C may be formed at various locations. For example, when the light emitting chip 100 has a substantially quadrangular shape as shown in the drawings, the first, second, third, and fourth contact parts 20C, 30C, 40C, and 50C may be disposed around each corner of the substantially quadrangular shape. However, the inventive concepts are not limited thereto, and in some exemplary embodiments, the light emitting chip 100 may be formed to have various shapes, and the first, second, third, and fourth contact parts 20C, 30C, 40C, and 50C may be formed in other places depending on the shape of the light emitting device.

The first, second, third, and fourth pads 20pd, 30pd, 40pd, and 50pd are spaced apart from and insulated from each other. In addition, the first, second, third, and fourth bump electrodes 20bp, 30bp, 40bp, and 50bp are spaced apart from and insulated from each other. According to an exemplary embodiment, each of the first, second, third, and fourth bump electrodes 20bp, 30bp, 40bp, and 50bp may cover at least a portion of side surfaces of the first, second, and third light emitting stacks 20, 30, and 40, which may facilitate dissipation of heat generated from the first, second, and third light emitting stacks 20, 30, and 40 therethrough.

The inventive concepts are not limited to a particular structure of the contact parts 20C, 30C, 40C, and 50C. For example, in some exemplary embodiments, the bump electrode 20bp, 30bp, 40bp, or 50bp may be omitted from at least one the contact parts 20C, 30C, 40C, and 50C. In this case, the pads 20pd, 30pd, 40pd, and 50pd of the contact parts 20C, 30C, 40C, and 50C may be connected to the respective connection electrodes 20ce, 30ce, 40ce, and 50ce.

Figure 10A:
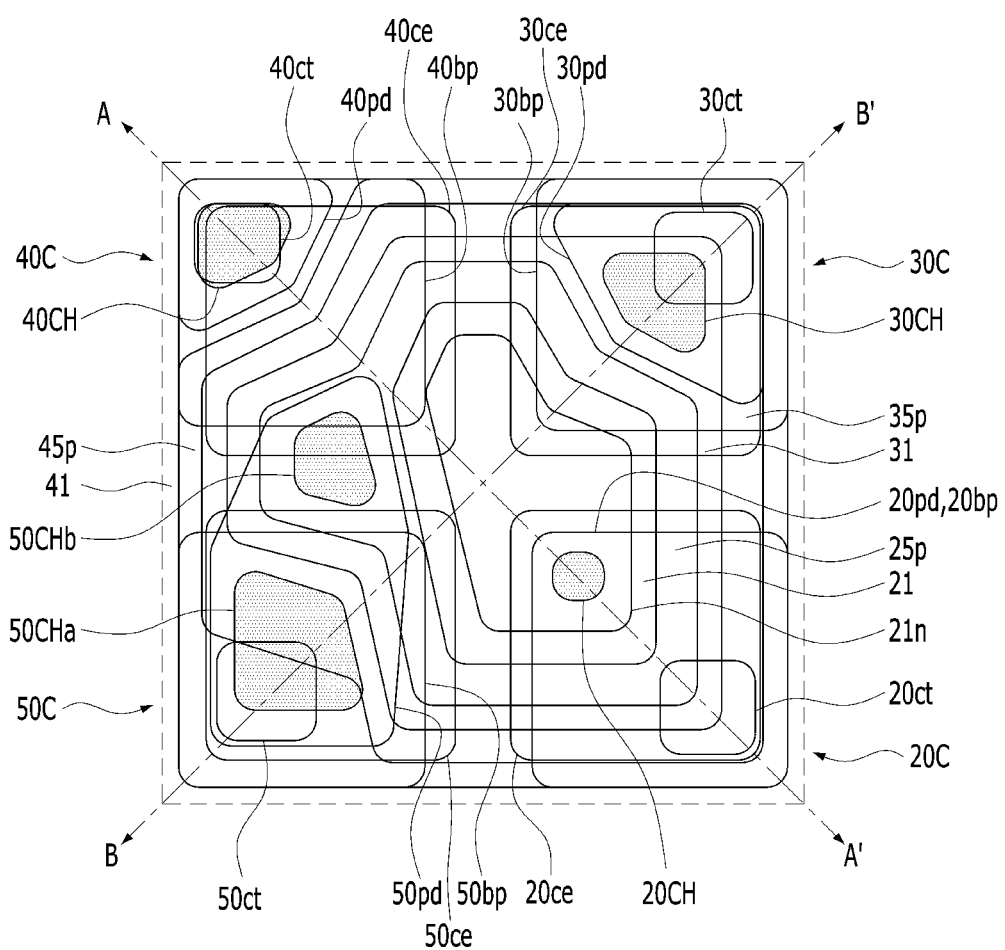
FIG. 10A is a schematic plan view illustrating a process of manufacturing a light emitting chip according to an exemplary embodiment.
Figure 10B:
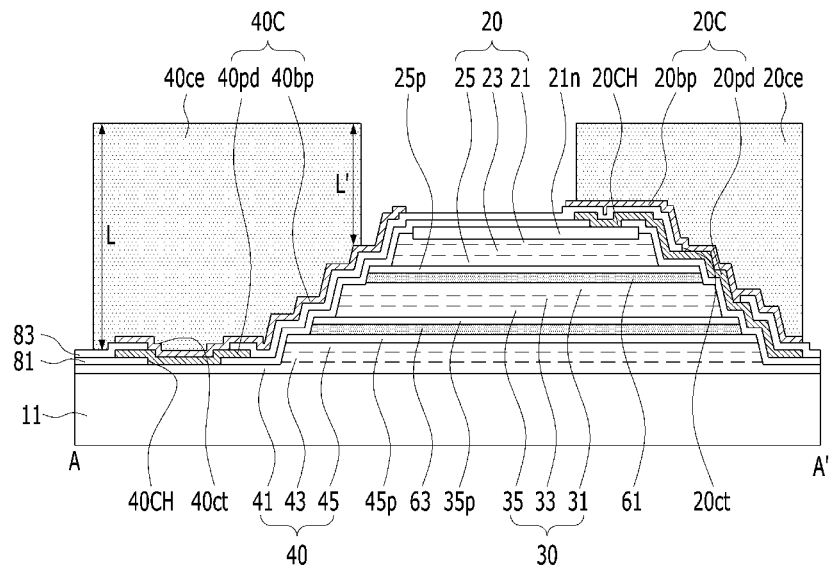
FIG. 10B and FIG. 10C are schematic cross-sectional views taken along line A-A' and line B-B' of FIG. 10A, respectively.
Figure 10C:
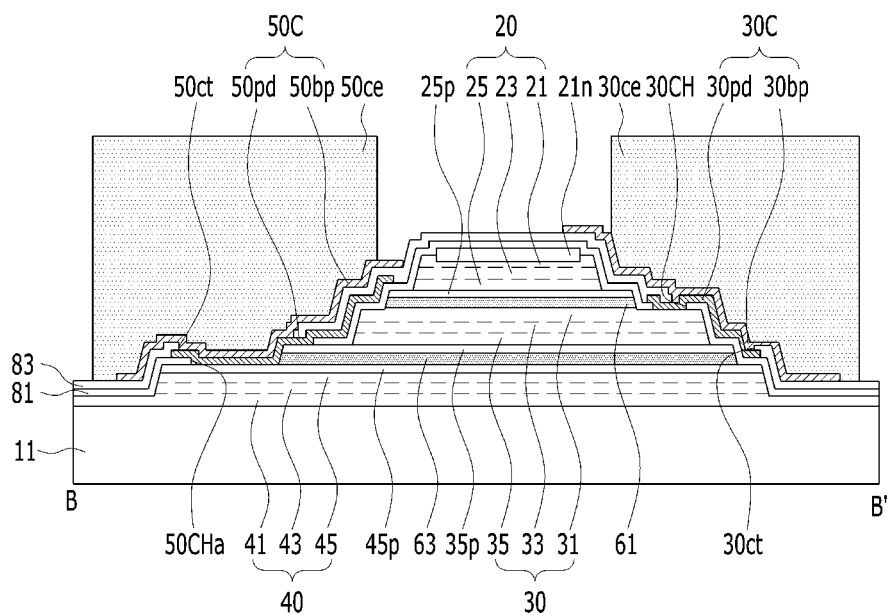

FIG. 10A is a schematic plan view illustrating a process of manufacturing a light emitting chip according to an exemplary embodiment, and FIG. 10B and FIG. 10C are schematic cross-sectional views taken along line A-A' and line B-B' of FIG. 10A, respectively.

Referring to FIGS. 10A, 10B, and 10C, first, second, third, and fourth connection electrodes 20ce, 30ce, 40ce, and 50ce spaced apart from each other may be formed on the light emitting stacked structure. The first, second, third, and fourth connection electrodes 20ce, 30ce, 40ce, and 50ce may be electrically connected to the first, second, third, and fourth bump electrodes 20bp, 30bp, 40bp, and 50bp, respectively, to transmit an external signal to each of the light emitting stacks 20, 30, and 40. More particularly, according to the illustrated exemplary embodiment, the first connection electrode 20ce may be connected to the first bump electrode 20bp, which is connected to the first upper contact electrode 21n through the first pad 20pd, to be electrically connected to the first-type semiconductor layer 21 of the first light emitting stack 20. The second connection electrode 30ce may be connected to the second bump electrode 30bp, which is connected to the second pad 30pd, to be electrically connected to the first-type semiconductor layer 31 of the second light emitting stack 30. The third connection electrode 40ce may be connected to the third bump electrode 40bp, which is connected to the third pad 40pd, to be electrically connected to the first-type semiconductor layer 41 of the third light emitting stack 40. The fourth connection electrode 50ce may be connected to the fourth bump electrode 50bp, which is connected to the fourth pad 50pd, to be electrically connected to the second-type semiconductor layers 25, 35, and 45 of the light emitting stacks 20, 30, and 40 via the first, second, and third lower contact electrodes 25p, 35p, and 45p, respectively.

According to the illustrated exemplary embodiment, each of the connection electrodes 20ce, 30ce, 40ce, and 50ce may have a substantially elongated shape that projects vertically away from the substrate 11. The connection electrodes 20ce, 30ce, 40ce, and 50ce may include metal, such as Cu, Ni, Ti, Sb, Zn, Mo, Co, Sn, Ag, or an alloy thereof, without being limited thereto. For example, each of the connection electrodes 20ce, 30ce, 40ce, and 50ce may include two or more metals or a plurality of different metal layers to reduce the stress applied thereto from the elongated shape of the connection electrodes 20ce, 30ce, 40ce, and 50ce. In another exemplary embodiment, when the connection electrodes 20ce, 30ce, 40ce, and 50ce include Cu, an additional metal may be deposited or plated thereon to suppress oxidation of Cu. In some exemplary embodiments, when the connection electrodes 20ce, 30ce, 40ce, and 50ce include Cu/Ni/Sn, Cu may prevent Sn from being infiltrating into the light emitting stacked structure. In some exemplary embodiments, the connection electrodes 20ce, 30ce, 40ce, and 50ce may include a seed layer for forming metal layer during a plating process, which will be described in more detail below.

As shown in the drawings, each of the connection electrodes 20ce, 30ce, 40ce, and 50ce may have a substantially flat upper surface to facilitate an electrical connection between the light emitting stacked structure with external lines or electrodes to be described later. According to an exemplary embodiment, when the light emitting chip includes a micro-LED, which has a surface area less than about 10,000 square µm as known in the art, or less than about 4,000 square µm or 2,500 square µm in other exemplary embodiments, the connection electrodes 20ce, 30ce, 40ce, and 50ce may overlap a portion of at least one of the first, second, and third light emitting stacks 20, 30, and 40 as shown in the drawings. More particularly, the connection electrodes 20ce, 30ce, 40ce, and 50ce may overlap at least one step formed in a side surface of the light emitting stacked structure. In this manner, since an area of the bottom surface of a connection electrode is greater than the top surface thereof, a greater contacting area may be formed between the connection electrodes 20ce, 30ce, 40ce, and 50ce and the light emitting stacked structure. Accordingly, the connection electrodes 20ce, 30ce, 40ce, and 50ce may be more stably formed on the light emitting stacked structure. For example, one side surface L of the connection electrodes 20ce, 30ce, 40ce, and 50ce that faces the outside and the other side surface L' thereof facing the center of the light emitting chip 100 may have different lengths (or heights). More particularly, the length of one side surface L of a connection electrode facing the outside may be greater than that of the other surface L' thereof facing the center of the light emitting chip 100. For example, the difference in length between the two opposing surfaces L and L' of a connection electrode may be greater than a thickness (or height) of at one of the LED stacks 20, 30, and 40. In this manner, the structure of the light emitting chip may be reinforced with a greater contact area between the connection electrodes 20ce, 30ce, 40ce, and 50ce and the light emitting stacked structure. In addition, since the connection electrodes 20ce, 30ce, 40ce, and 50ce may overlap at least one step formed in a side surface of the light emitting stacked structure, heat generated from the light emitting stacked structure may be more efficiently dissipated to the outside.

According to an exemplary embodiment, the different in length between one side surface of the connection electrode L facing the outside and the other surface thereof L' facing the center of the light emitting chip 100 may be about 3 µm. In this case, the light emitting stacked structure may be formed to be thin, and in particular, the first LED stack 20 may have a thickness of about 1 µm, the second LED stack 30 may have a thickness of about 0.7 µm, the third LED stack 40 may have a thickness of about 0.7 µm, and the first and second adhesive layers 61 and 63 may each have a thickness of about 0.2 µm to about 0.3 µm, without being limited thereto. According to another exemplary embodiment, the different in length between one side surface of the connection electrode L facing the outside and the other surface thereof L' facing the center of the light emitting chip 100 may be about 10 µm to 16 µm. In this case, the light emitting stacked structure may be formed to be relatively thick and have more stable structure, and in particular, the first LED stack 20 may have a thickness of about 4 µm to about 5 µm, the second LED stack 30 may have a thickness of about 3 µm, the third LED stack 40 may have a thickness of about 3 µm, and the first and second adhesive layers 61 and 63 may each have a thickness of about 3 µm, without being limited thereto. However, the inventive concepts are not limited to a particular difference in length between the opposing surfaces of the connection electrodes, and the difference in length between the opposing surfaces of the connection electrodes may be varied.

In some exemplary embodiments, at least one of the connection electrodes 20ce, 30ce, 40ce, and 50ce may overlap a side surface of each of the light emitting stacks 20, 30, and 40, thereby balancing the temperature between each of the light emitting stacks 20, 30, and 40, and efficiently dissipate the internally generated heat to the outside. In addition, when the connection electrodes 20ce, 30ce, 40ce, and 50ce include a reflective material, such as metal, the connection electrodes 20ce, 30ce, 40ce, and 50ce may reflect light emitted from at least one or more light emitting stacks 20, 30, and 40, thereby improving light efficacy.

A method of forming the first, second, third, and fourth connection electrodes 20ce, 30ce, 40ce, and 50ce is not particularly limited. For example, according to an exemplary embodiment, a seed layer may be deposited on the light emitting stacked structure as a conductive surface, and the seed layer may be patterned by using a photo-lithography or the like, such that the seed layer is disposed at desired locations where the connection electrodes are to be formed. Then, the seed layer may be plated with metal, such as Cu, Ni, Ti, Sb, Zn, Mo, Co, Sn, Ag, or an alloy thereof, and the seed layer may be removed. In some exemplary embodiments, an additional metal may be deposited or plated on the plated metal (e.g., the connection electrodes), by an electroless nickel immersion gold (ENIG) or the like, to prevent or at least suppress oxidation of the plated metal. In some exemplary embodiments, the seed layer may remain in each connection electrode.

According to an exemplary embodiment, when the bump electrodes 20bp, 30bp, 40bp, and 50bp are omitted from the contact parts 20C, 30C, 40C, and 50C, the pads 20pd, 30pd, 40pd, and 50pd may be connected to the respective connection electrodes 20ce, 30ce, 40ce, and 50ce. For example, after the through-holes 20ct, 30ct, 40ct, and 50ct are formed to partially expose the pads 20pd, 30pd, 40pd, and 50pd of the contact parts 20C, 30C, 40C, and 50C, a seed layer may be deposited on the light emitting stacked structure as a conductive surface, and the seed layer may be patterned by using a photo-lithography or the like, such that the seed layer is disposed at desired locations where the connection electrodes are to be formed. In this case, the seed layer may overlap at least a portion of each pad 20pd, 30pd, 40pd, and 50pd. According to an exemplary embodiment, the seed layer may be deposited to a thickness of about 1000 Å, without being limited thereto. Then, the seed layer may be plated with metal, such as Cu, Ni, Ti, Sb, Zn, Mo, Co, Sn, Ag, or an alloy thereof, and the seed layer may be removed. In some exemplary embodiments, an additional metal may be deposited or plated on the plated metal (e.g., the connection electrodes), by an electroless nickel immersion gold (ENIG) or the like, to prevent or at least suppress oxidation of the plated metal. In some exemplary embodiments, the seed layer may remain in each connection electrode.

FIGS. 11, 12, 13, 14, 15, 16, and 17 are schematic cross-sectional views illustrating a process of manufacturing the light emitting package of FIG. 1 according to an exemplary embodiment.

In general, during manufacture, an array of a plurality of light emitting chips is formed on a substrate. The substrate may then be cut along scribing lines to singularize (to separate) each light emitting chip, and the light emitting chips may be transferred to another substrate or tape using various transferring technologies for further processing of the light emitting chips, such as packaging. In this case, when the light emitting chip includes connection electrodes, such as metal bumps or pillars that protrude outwardly from the light emitting structure, various problems may occur during subsequent processes, such as in the steps of transfer, due to the structure of the bare light emitting chip exposing the connection electrodes to the outside. Moreover, when the light emitting chips include a micro-LED, which has a surface area less than about 10,000 square μm, or less than about 4,000 square μm, or less than about 2,500 square μm, depending upon applications, handling of the light emitting chips may become more difficult due to its small form factor.

For example, when the connection electrodes have a substantially elongated shape, such as a bar, transferring the light emitting chips using a conventional vacuum method becomes difficult as the light emitting chip may not have sufficient suction area due to the protruding structure of the connection electrodes. Furthermore, the exposed connection electrodes may be directly subject to various stresses during subsequent processes, such as when the connection electrodes contact a manufacturing device, which may cause damage to the structure of the light emitting chip. As another example, when the light emitting chips are transferred by attaching an adhesive tape on a top surface of the light emitting chips (e.g., a surface opposing the substrate), the contacting area between the light emitting chips and the adhesive tape may be limited to top surfaces of the connecting electrodes. In this case, the adhesion of the light emitting chip to the adhesion tape may become weak, as opposed to when the adhesion tape is attached to a bottom surface of the chip (e.g., substrate), and the light emitting chips may be undesirably detached from the adhesive tape while being transferred. As another example, when the light emitting chip is transferred using a conventional pick-and-place method, an ejection pin may directly contact a portion of the light emitting chip disposed between the connection electrodes, and damage a top structure of the light emitting structure.

Figure 11:
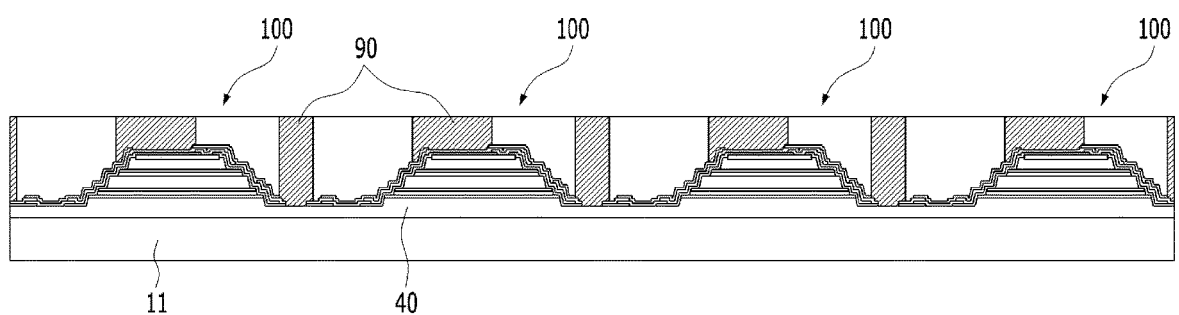
FIGS. 11, 12, 13, 14, 15, 16, and 17 are schematic cross-sectional views illustrating a process of manufacturing the light emitting package of FIG. 1 according to an exemplary embodiment.

FIG. 11 shows an array of the light emitting stacked structures formed on the substrate 11. Referring to FIG. 11, the passivation layer 90 is disposed between the connection electrodes 20ce, 30ce, 40ce, and 50ce. The passivation layer 90 may be formed to be substantially flush with top surfaces of the connection electrodes 20ce, 30ce, 40ce, and 50ce by a polishing process or the like. In this manner, the passivation layer 90 may protect the light emitting structure from an external impact that may be applied during subsequent processes, as well as providing a sufficient contact area to the light emitting chip 100 to facilitate its handling during subsequent transferring steps. In addition, the passivation layer 90 may prevent leakage of light towards a side surface of the light emitting chip 100, so as to prevent or at least suppress interference of light emitted from adjacent light emitting chips 100.

Figure 12:
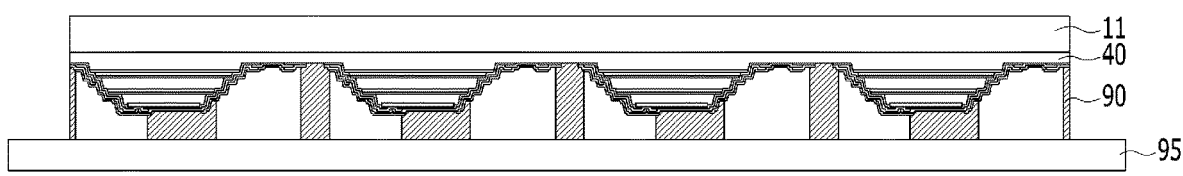

Referring to FIG. 12, the substrate 11 on which the light emitting chips 100 are formed (e.g., growth substrate) may be mounted on a temporary substrate 95. The temporary substrate 95 is not particularly limited as long as it can support the array of the light emitting chips 100 during subsequent processes. For example, in some exemplary embodiments, the temporary substrate 95 may be a tape.

Figure 13:
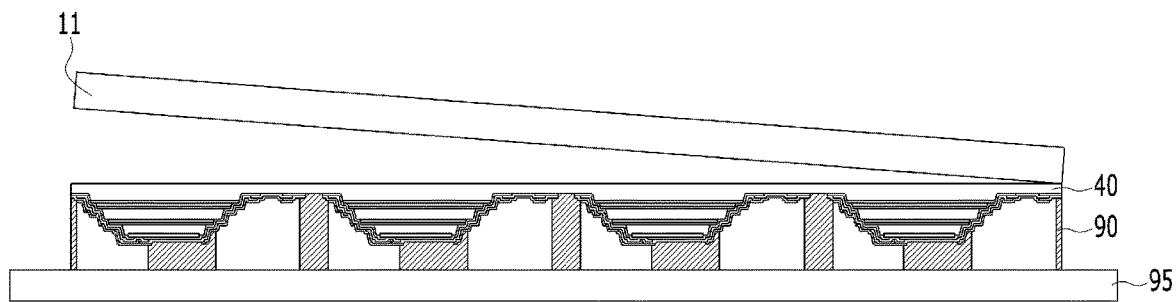

Referring the FIG. 13, the substrate 11 may be removed from the light emitting chips 100 using various known methods in the art. For example, in some exemplary embodiments, a laser beam may be irradiated to the substrate 11 to lift the substrate 11 off from the light emitting chips 100, such as using a known laser lift-off (LLO) method. In this manner, since the substrate 11 is removed from the light emitting chips 100, light emitted from the light emitting chip 100 does not pass through the substrate 11, thereby increasing light efficacy and color purity of the light emitting chip 100. In this case, even though the substrate 11 is removed from the light emitting chip 100, since the light emitting chip 100 constructed according to an exemplary embodiment has a reinforced structure formed at least in part by connection electrodes 20ce, 30ce, 40ce, and 50ce that have substantially elongated shape, and a passivation layer 90 surrounding at least the sides of the connection electrodes 20ce, 30ce, 40ce, and 50ce, the light emitting chip 100 may withstand various external stress applied thereto, which may occur during manufacture or in use.

In some exemplary embodiments, a concave-convex portion may be formed on a surface of the third LED stack 40 that is exposed from removing the substrate 11, to balance the visibility of light emitted from each light emitting stack.

Figure 14:
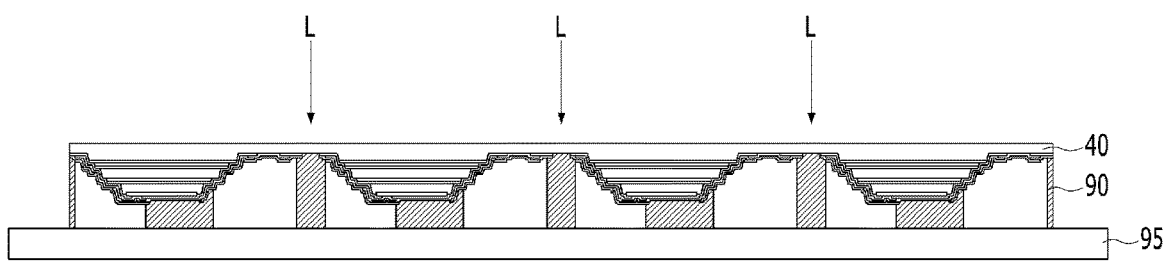
Figure 15:
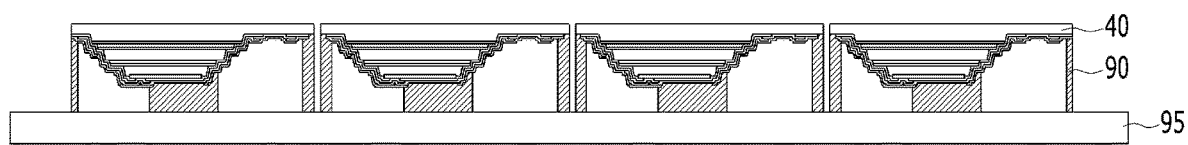

Referring to FIGS. 14 and 15, according to an exemplary embodiment, a laser L may be irradiated between the light emitting chips 100 to singularize (separate) the light emitting chips 100 from each other. However, the inventive concepts are not limited to a particular method used for separating the light emitting chips 100. For example, in some exemplary embodiments, the light emitting chips 100 may be singularized by using a blade or the like to cut mechanically along scribing lines.

Figure 16:
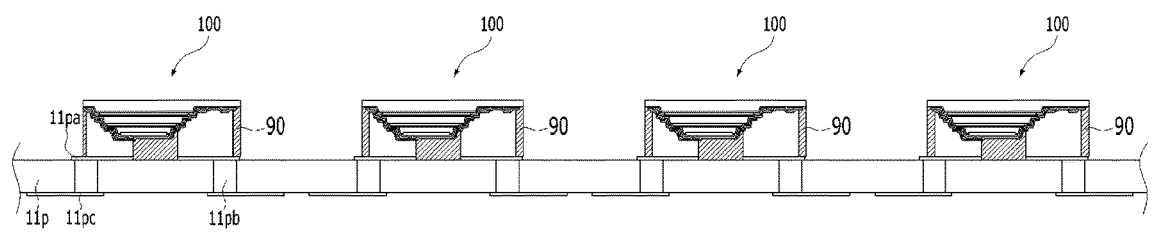

Referring to FIG. 16, the light emitting chips 100 may be transferred and be mounted on the circuit board 11p. Once or before the light emitting chips 100 are mounted on the circuit board 11p, the temporary substrate 95 may be removed.

In an exemplary embodiment, the circuit board 11p may include the lower circuit electrodes 11pa, the upper circuit electrodes 11pc, and the middle circuit electrodes 11pb disposed therebetween, which are electrically connected to each other. The lower circuit electrodes 11pa may be connected to each of the first, second, third, and fourth connection electrodes 20ce, 30ce, 40ce, and 50ce, respectively. In some exemplary embodiments, the lower circuit electrodes 11pa may be surface treated by ENIG, to facilitate electrical connection to the connection electrodes of the light emitting chip 100 by being partially melt at high temperature.

According to an exemplary embodiment, the first, second, third, and fourth connection electrodes 20ce, 30ce, 40ce, and 50ce of the light emitting chips 100 may be bonded to the lower circuit electrodes 11pa of the circuit board 11p, respectively, by an anisotropic conductive film (ACF) bonding, for example. When the light emitting chips 100 are bonded to the circuit board 11p through ACF bonding, which may be performed at a lower temperature than in other bonding methods, the light emitting chips 100 may be protected from being exposed to a high temperature during bonding. However, the inventive concepts are not limited to a particular bonding method. For example, in some exemplary embodiments, the light emitting chips 100 may be bonded to the circuit board 11p using an anisotropic conductive paste (ACP), solder, ball grid area (BGA), or micro bumps including at least one of Cu and Sn. In this case, since the upper surfaces of the connection electrodes 20*ce*, 30*ce*, 40*ce*, and 50*ce* and the passivation layer 90 are substantially flush with each other due to a polishing process or the like, the adhesiveness of the light emitting chips 100 to an anisotropic conductive film may be increased, thereby forming a more stable structure when bonded to the circuit board 11*p*.

According to an exemplary embodiment, the upper circuit electrodes 11*pc* may be spaced apart from each other at a predetermined pitch. For example, the pitch between the upper circuit electrodes 11*pc* may correspond to that of electrodes of a target substrate, such as a display device. In this manner, the light emitting package 110 according to an exemplary embodiment may be mounted on a conventional display device, without changing the configuration of the target substrate of the display device.

Figure 17:
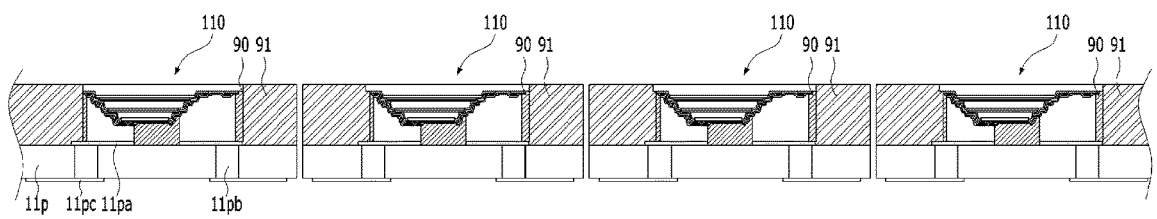

Referring to FIG. 17, a molding layer 91 may be formed on the light emitting chips 100 mounted on the circuit board 11*p* after the passivation layer 90 is formed. The molding layer 91 may surround at least the sides of the light emitting chip 100 to protect the light emitting chip 100 from external impact. According to the illustrated exemplary embodiment, the molding layer 91 may expose at least one surface of the light emitting chip 100 to increase light efficacy. In this case, since the light emitting chip 100 according to the illustrated exemplary embodiment does not include the growth substrate 11, light emitted from the light emitting package 110 may have increased brightness and purity. According to an exemplary embodiment, the molding layer 91 may include organic or inorganic polymer. In some exemplary embodiments, the molding layer 91 may include substantially the same material as the passivation layer 90. But, since the molding layer 91 is formed subsequently the two layers are distinct even if formed from the same material. However, the inventive concepts are not limited thereto, and in some exemplary embodiments, the molding layer 91 and the passivation layer 90 may include materials different from each other.

The light emitting chips 100 surrounded by the molding layer 91 may then be cut to provide the light emitting package 110 of FIG. 1. Although FIG. 17 shows that the light emitting package 110 includes one light emitting chip 100 therein, the inventive concepts are not limited to a particular number of light emitting chips 100 in a light emitting package. For example, in some exemplary embodiments, the light emitting chips 100 surrounded by the molding layer 91 may be cut in a desired configuration, such a light emitting package may include at least one or more light emitting chips 100 therein, through various methods known in the art, in consideration of a final device to which the light emitting package may be mounted, such as a display device. For example, the light emitting package 110 may include one or more light emitting chips 100 arranged in n×m arrangement, where n and m are natural numbers.

Figure 18:
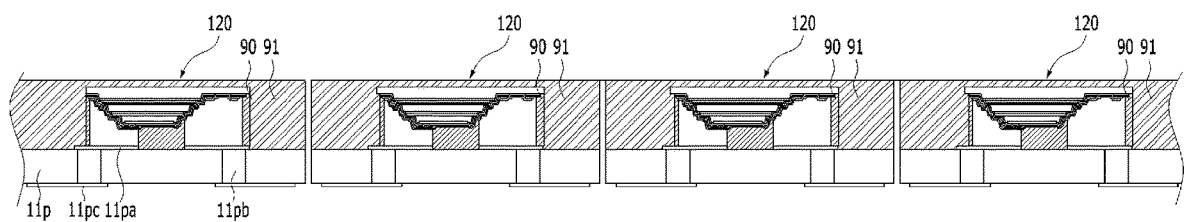
FIG. 18 is a schematic cross-sectional view illustrating a process of manufacturing the light emitting package of FIG. 2 according to another exemplary embodiment.

FIG. 18 is a schematic cross-sectional view illustrating a process of manufacturing the light emitting package of FIG. 2 according to another exemplary embodiment.

Referring to FIG. 18, according to another exemplary embodiment, the molding layer 91 may be formed to cover a top surface of the light emitting chip 100 (e.g., third LED stack 40). As described above, in this case, the molding layer 91 may include an organic polymer or an inorganic polymer that has photosensitivity, to transmit light emitting from the light emitting chip 100. In this manner, the light emitting chip 100 of the light emitting package 120 may be protected from external stress or the like. Then, the light emitting chips 100 surrounded by the molding layer 91 may be cut to provide the light emitting package 120 of FIG. 2. Although FIG. 18 shows that the light emitting package 120 includes one light emitting chip 100 therein, the inventive concepts are not limited to a particular number of light emitting chips 100 in a light emitting package. For example, in some exemplary embodiments, the light emitting chips 100 surrounded by the molding layer 91 may be cut in a desired configuration, such a light emitting package may include at least one or more light emitting chips 100 therein, through various methods known in the art.

As described above, FIGS. 11 to 17 exemplarily illustrate a process in which the passivation layer 90 is formed before the light emitting chips 100 are isolated (or singularized) from each other. However, the inventive concepts are not limited thereto. For example, in some exemplary embodiments, the light emitting chips 100 formed on the substrate 11 may be isolated from each other prior to the process of forming the passivation layer 90 thereon. More particularly, referring back to FIG. 11, an isolation process may be performed prior to forming the passivation layer 90 on the light emitting chips 100, such that the third light emitting stack 40 formed substantially throughout the substrate 11 across the light emitting chips 100 may be separated from each other, thereby exposing at least a portion of the substrate 11 between the light emitting chips 100. In this case, at least a side surface of the third light emitting stack 40 between the light emitting chips 100 may also be exposed from the isolation process. As such, when the passivation layer 90 is formed on each of the light emitting chips 100 during a subsequent process, the passivation layer 90 may also cover the exposed side surface of the third light emitting stack 40, in addition to the surfaces of the light emitting chips 100 shown in FIG. 11. In this manner, the passivation layer 90 may further improve the reliability of the light emitting chip 100 from external environment. In addition, the passivation layer 90 may substantially block light emitted from each light emitting stack towards a longitudinal direction thereof, thereby improving light efficacy towards a vertical direction of the light emitting chip 100.

Figure 19:
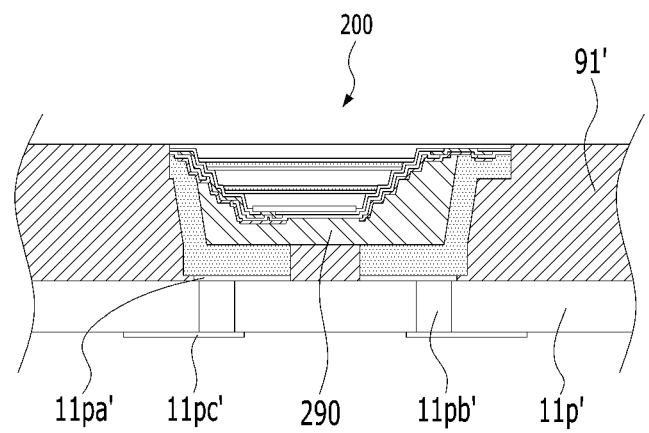
FIG. 19 is a schematic cross-sectional view of a light emitting package constructed according to an exemplary embodiment of the invention.
Figure 20:
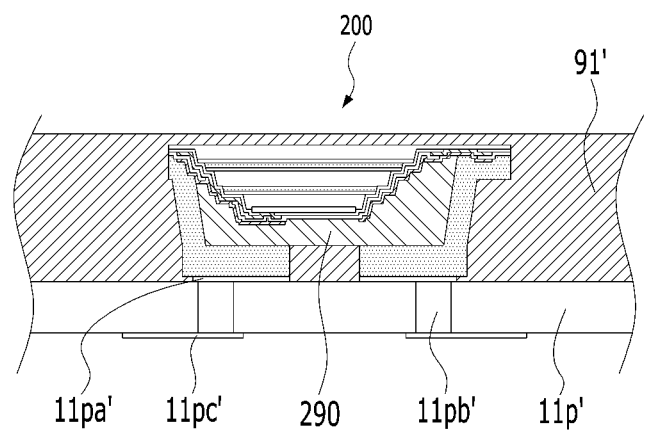
FIG. 20 is a schematic cross-sectional view of a light emitting package constructed according to another exemplary embodiment of the invention.

FIG. 19 is a schematic cross-sectional view of a light emitting package constructed according to an exemplary embodiment of the invention, and FIG. 20 is a schematic cross-sectional view of a light emitting package constructed according to another exemplary embodiment of the invention.

Referring to FIG. 19, a light emitting package 210 according to an exemplary embodiment includes a light emitting chip 200, a circuit board 11*p*' including a lower circuit electrode 11*pa*', a middle circuit electrode 11*pb*', and an upper circuit electrode 11*pc*', and a molding layer 91' surrounding at least the sides of the light emitting chip 200.

The molding layer 91' may surround at least the sides of the light emitting chip 200 to protect the light emitting chip 200 from external impact. According to the illustrated exemplary embodiment, the molding layer 91' may expose at least one surface of the light emitting chip 200 to increase light efficacy and color purity. In this case, since the light emitting chip 200 according to the illustrated exemplary embodiment does not include a substrate on which the light emitting stacked structure was grown, light emitted from the light emitting package 210 may have increased brightness and purity. According to an exemplary embodiment, the molding layer 91' may include organic or inorganic polymer. In some exemplary embodiments, the molding layer 91' may include substantially the same material as the passivation layer 290.

However, the inventive concepts are not limited thereto, and in some exemplary embodiments, the molding layer 91' and the passivation layer 290 may include materials different from each other.

The light emitting package 210 according to an exemplary embodiment has substantially the same as the light emitting package 110 of FIG. 1, except for the shape of connection electrodes and that the light emitting chip 200 includes a passivation layer 290 formed between the connection electrodes, which will be described in more detail below. The circuit board 11p' and constituent elements thereof are substantially the same as the circuit board 11p described above, and thus, repeated descriptions thereof will be omitted to avoid redundancy.

According to an exemplary embodiment, the upper electrodes 11pc' of the light emitting package 210 may be spaced apart from each other at a predetermined pitch that corresponds to a pitch of the electrodes of the final device. In this manner, the light emitting package 210 may be easily mounted on a substrate of a final device, such as a display device, even if the layout of its electrodes of the final device was designed for a conventional light emitting device.

Referring to FIG. 20, a light emitting package 220 according to an exemplary embodiment is substantially the same as the light emitting package 210 of FIG. 19, except for the shape of the molding layer 91'. More particularly, the molding layer 91' according to the illustrated exemplary embodiment covers a top surface of the light emitting chip 200. In this manner, the molding layer 91' may protect the light emitting chip 200 from external impact or external particles, such as dust and moisture, from infiltrating into the light emitting stacked structure. In addition, when the molding layer 91' covers the top surface of the light emitting chip 200 as shown in FIG. 20, the transmittance of light may be controlled by adjusting the thickness of the molding layer 91' or by forming the molding layer 91' with a material that provides a desired light transmittance. Since the light emitting package 220 is substantially the same as the light emitting package 210 of FIG. 19 except for the shape of the molding layer 91', repeated descriptions of the constituent elements thereof will be omitted to avoid redundancy.

Figure 21A:
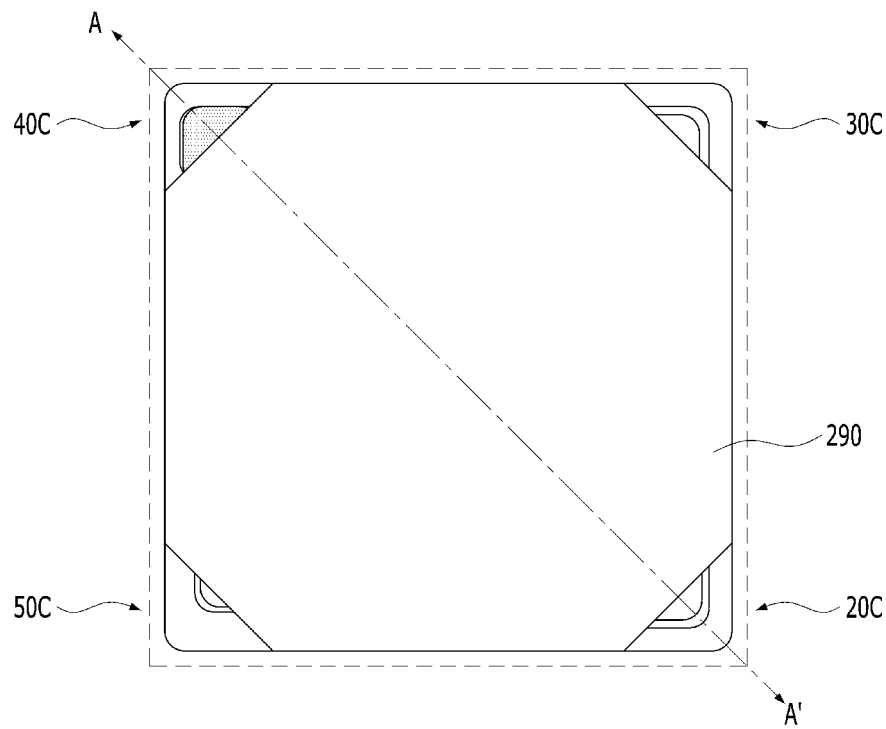
FIGS. 21A and 22A are plan views illustrating a process of manufacturing a light emitting chip according to another exemplary embodiment.
Figure 21B:
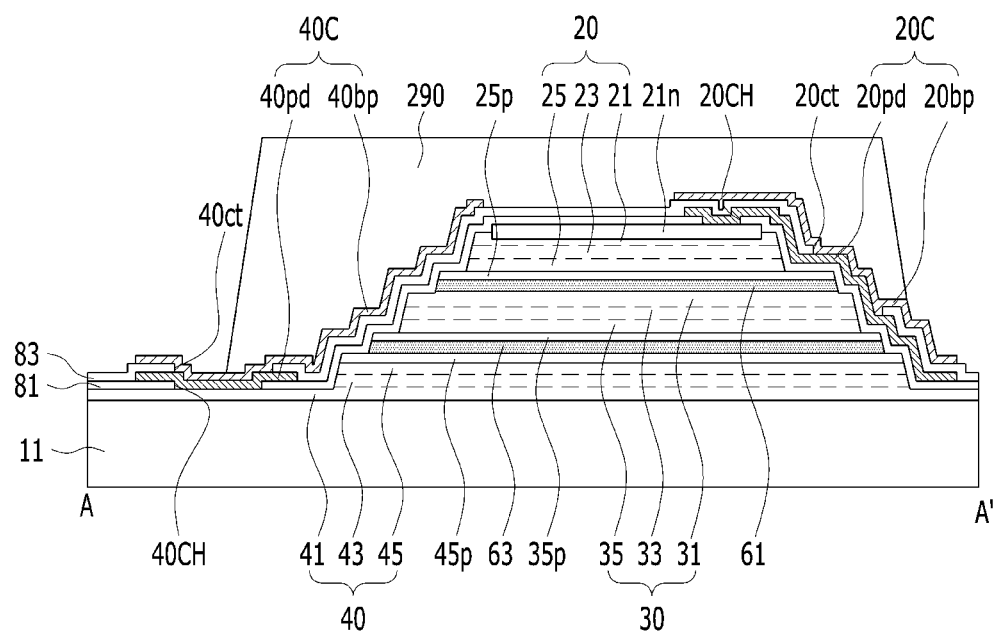
FIGS. 21B and 22B are cross-sectional views taken along line A-A' of its corresponding plan view shown in FIGS. 21A and 22A according to another exemplary embodiment.
Figure 22A:
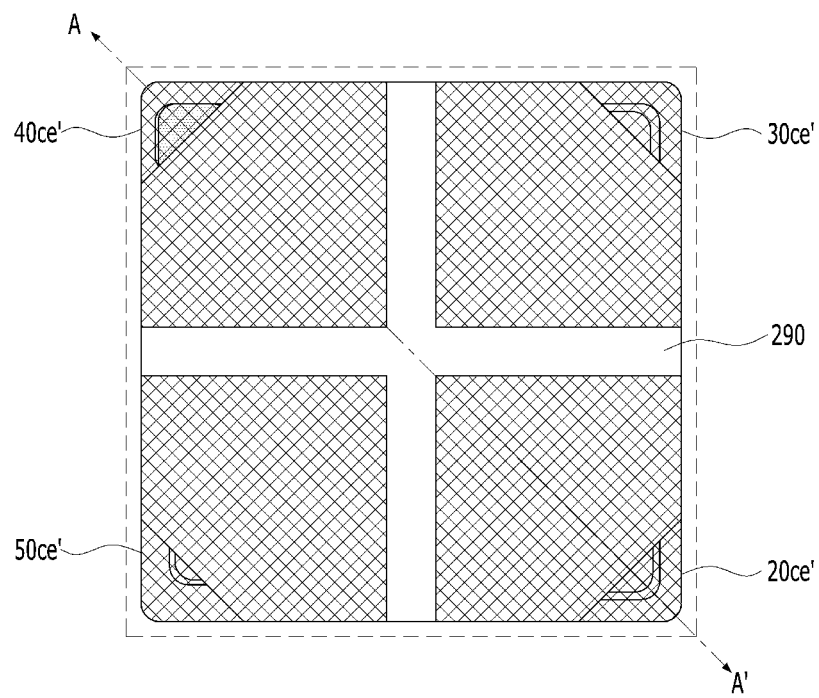
Figure 22B:
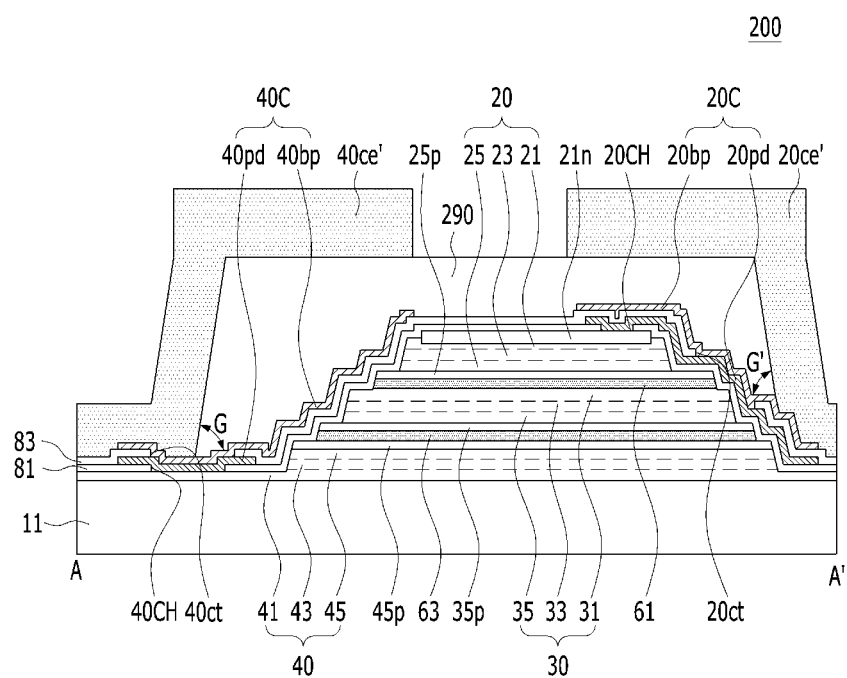

FIGS. 21A and 22A are plan views illustrating a process of manufacturing a light emitting chip according to another exemplary embodiment. FIGS. 21B and 22B are cross-sectional views taken along line A-A' of its corresponding plan view shown in FIGS. 21A and 22A according to another exemplary embodiment.

Referring to FIGS. 21A and 21B, a light emitting chip 200 according to an exemplary embodiment includes a light emitting stacked structure, connection electrodes 20ce', 30ce', 40ce', and 50ce', and a passivation layer 290 formed therebetween. The light emitting stacked structure has a configuration substantially similar to that shown in FIGS. 9A and 9B. However, according to the illustrated exemplary embodiment, the passivation layer 290 may be formed to cover at least a portion of an upper surface of the light emitting stacked structure shown in FIGS. 9A and 9B. More particularly, the passivation layer 290 may cover at least a portion of an upper surface of the first light emitting stack 20 disposed on the top of the stacked structure, to protect the light emitting stacked structure from external stress during manufacture.

According to the illustrated exemplary embodiment, the passivation layer 290 may form an inclined angle with respect to the substrate 11. For example, the angle G and G' (see FIG. 22B) formed between the passivation layer 290 and the substrate 11 may be less than about 80°. When the inclined angle is greater than about 80°, the passivation layer 290 may not sufficiently cover steps formed on side surfaces of the light emitting stacked structure. In some exemplary embodiments, the inclined angle between the passivation layer 290 and the substrate 11 may be greater than about 600 and less than about 70°. In this manner, the connection electrodes 20ce', 30ce', 40ce', and 50ce' (see FIGS. 22A and 22B) to be formed on the passivation layer 290 may also be stably formed on the light emitting stacked structure. In some exemplary embodiments, an edge formed between a top surface and a side surface of the passivation layer 290 may form a smooth angle, such that the connection electrodes 20ce', 30ce', 40ce', and 50ce' to be formed thereon may have a substantially uniform thickness. However, the inventive concepts are not limited to, and in some exemplary embodiments, a substantially sharp edge may be formed between a top surface and a side surface of the passivation layer 290.

Referring to FIGS. 22A and 22B, according to the illustrated exemplary embodiment, the first, second, third, and fourth connection electrodes 20ce', 30ce', 40ce', and 50ce' spaced apart from each other are formed on the passivation layer 290. As described above, the first, second, third, and fourth connection electrodes 20ce', 30ce', 40ce', and 50ce' may be electrically connected to the first, second, third, and fourth bump electrodes 20bp, 30bp, 40bp, and 50bp, respectively, as in the first, second, third, and fourth connection electrodes 20ce, 30ce, 40ce, and 50ce of the light emitting chip 100, to transmit an external signal to each of the light emitting stacks 20, 30, and 40. More particularly, the first connection electrode 20ce' may be connected to the first bump electrode 20bp, which is connected to the first upper contact electrode 21n through the first pad 20pd, to be electrically connected to the first-type semiconductor layer 21 of the first light emitting stack 20. The second connection electrode 30ce' may be connected to the second bump electrode 30bp, which is connected to the second pad 30pd, to be electrically connected to the first-type semiconductor layer 31 of the second light emitting stack 30. The third connection electrode 40ce' may be connected to the third bump electrode 40bp, which is connected to the third pad 40pd, to be electrically connected to the first-type semiconductor layer 41 of the third light emitting stack 40. The fourth connection electrode 50ce' may be connected to the fourth bump electrode 50bp, which is connected to the fourth pad 50bp, to be electrically connected to the second-type semiconductor layers 25, 35, and 45 of the light emitting stacks 20, 30, and 40 via the first, second, and third lower contact electrodes 25p, 35p, and 45p, respectively.

A method of forming the first, second, third, and fourth connection electrodes 20ce', 30ce', 40ce', and 50ce' is not particularly limited. For example, according to an exemplary embodiment, a conductive layer may be deposited on the passivation layer 290, and the conductive layer may be patterned by using a photo-lithography or the like, such that each of the conductive layers overlaps a portion of the first bump electrode 20bp, second bump electrode 30bp, third bump electrode 40bp, and fourth bump electrode 50bp exposed by the passivation layer 290, respectively. The conductive layer (e.g., connection electrodes) according to an exemplary embodiment may include metal, such as Cu, Ni, Ti, Sb, Zn, Mo, Co, Sn, Ag, or an alloy thereof. In this case, a separate plating process may be omitted. In some exemplary embodiments, an additional metal may be deposited on the conductive layer, by an electroless nickel immersion gold (ENIG) or the like, to prevent or at least suppress oxidation of the connection electrodes 20ce', 30ce', 40ce', and 50ce'.

According to the illustrated exemplary embodiment, each of the connection electrodes 20ce', 30ce', 40ce', and 50ce' may have a curved or angled shape that protrudes away from the substrate 11 to substantially cover the light emitting stacked structure and the passivation layer 290. As shown in the drawings, each of the connection electrodes 20ce', 30ce', 40ce', and 50ce' may have a substantially flat upper surface to facilitate an electrical connection between the light emitting stacked structure and external lines or electrodes, as well as to increase the adhesiveness of the light emitting chip 200 to other elements, such as a PCB, during subsequent boding and transferring steps. The connection electrodes 20ce', 30ce', 40ce', and 50ce' according to the illustrated exemplary embodiment may surround the at least a portion of each light emitting stack 20, 30, and 40 to protect the light emitting stacked structure, such that the light emitting chip 200 has a more stable structure that can withstand various subsequent processes along with the passivation layer 290. For example, the connection electrodes 20ce', 30ce', 40ce', and 50ce' that surround at least the sides of the light emitting stacked structure may absorb at least a part of the stress that would otherwise be applied directly to the light emitting stacked structure, thereby protecting the light emitting chip during manufacture.

According to the illustrated exemplary embodiment, the third connection electrode 40ce' is shown as being asymmetrical to the first connection electrode 20ce'. More particularly, each of the connection electrodes 20ce', 30ce', 40ce', and 50ce' may have a portion that does not overlap the passivation layer 290, and FIG. 22B, for example, shows that a portion of the third connection electrode 40ce' not overlapping the passivation layer 290 is greater in area than that of the first connection electrode 20ce' near two opposing ends of the substrate 11. However, the inventive concepts are not limited thereto, and in some exemplary embodiments, each of the connection electrodes 20ce', 30ce', 40ce', and 50ce' may be symmetrical to each other. For example, a portion of each of the connection electrodes 20ce', 30ce', 40ce', and 50ce' that does not overlap the passivation layer 290 may have the same area as each other Although the drawings show that the passivation layer 290 is not formed between the portions of the connection electrodes 20ce', 30ce', 40ce', and 50ce' that are disposed on a top surface of the passivation layer 290, however, the inventive concepts are not limited thereto. For example, in some exemplary embodiments, the passivation layer 290 may be formed between the connection electrodes 20ce', 30ce', 40ce', and 50ce', such that the upper surface of the passivation layer 290 may be substantially flush with the upper surfaces of the connection electrodes 20ce', 30ce', 40ce', and 50ce'. In this manner, the adhesiveness of the light emitting chip 200 to the PCB or the like may be further strengthened during subsequent processes. A portion of the passivation layer 290 that is disposed between the connection electrodes 20ce', 30ce', 40ce', and 50ce' may be formed before or after forming the connection electrodes 20ce', 30ce', 40ce', and 50ce'. Since the constituent elements of the light emitting chip 200 according to the illustrated exemplary embodiment are substantially the same as those of the light emitting chip 100 described above, repeated descriptions of the substantially the same elements will be omitted to avoid redundancy.

Figure 23:
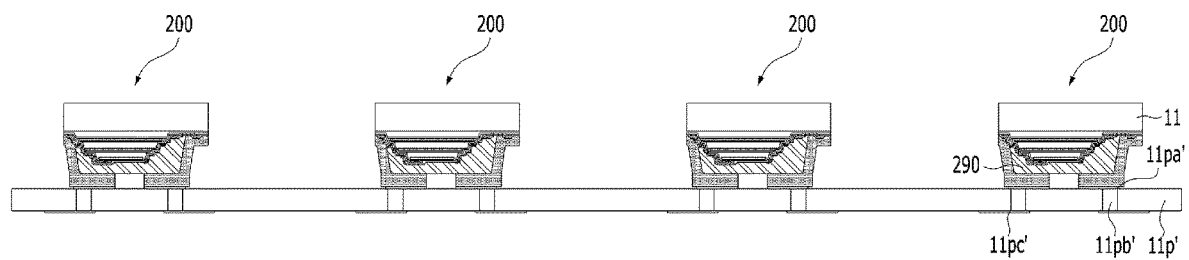
FIGS. 23 and 24 are schematic cross-sectional views illustrating a process of manufacturing a light emitting package according to an exemplary embodiment.
Figure 24:
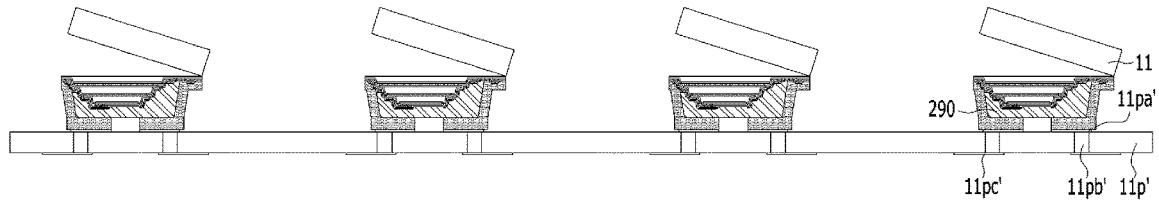

FIGS. 23 and 24 are schematic cross-sectional views illustrating a process of manufacturing a light emitting package according to an exemplary embodiment.

Referring to FIG. 22, an array of the light emitting chips 200 formed on the growth substrate 11 may be separated from each other, and be transferred to be mounted on a circuit board 11p'. The circuit board 11p' according to an exemplary embodiment is substantially the same as the circuit board 11p described above, and thus, repeated descriptions thereof will be omitted to avoid redundancy. As described above, the upper circuit electrodes 11pc' of the circuit board 11p' may be spaced apart from each other at a desired pitch, such that conforms to that of electrodes of a final device, such as a display device.

Referring to FIG. 24, once the light emitting chips 200 separated from each other are mounted on the circuit board 11p', the substrate 11 of the light emitting chip 200 may be removed through various known methods in the art, such as through an LLO method. In this manner, since the substrate 11 is removed from the light emitting chips 200, light emitted from the light emitting chip 200 does not pass through the substrate 11, thereby increasing light efficacy and color purity of the light emitting chip 200. In this case, even though the substrate 11 is removed from the light emitting chip 200, since the light emitting chip 200 constructed according to an exemplary embodiment has a reinforced structure due at least in part to the passivation layer 290 and the connection electrodes 20ce', 30ce', 40ce', and 50ce' having the curved shape, the light emitting chip 200 may withstand various external stress applied thereto, which may occur during manufacture or in use.

Although FIGS. 23 and 24 show that the growth substrate 11 is removed from the light emitting chip 200 after the substrate 11 is cut (e.g., the light emitting chips 200 being singularized), however, the inventive concepts are not limited thereto.

FIGS. 25, 26, 27, 28, and 29 are schematic cross-sectional views illustrating a process of manufacturing the light emitting package of FIG. 19 according to an exemplary embodiment.

Figure 25:
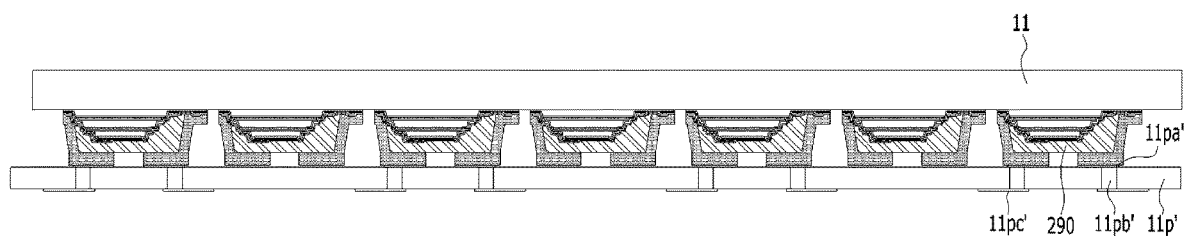
FIGS. 25, 26, 27, 28, and 29 are schematic cross-sectional views illustrating a process of manufacturing the light emitting package of FIG. 19 according to an exemplary embodiment.
Figure 26:
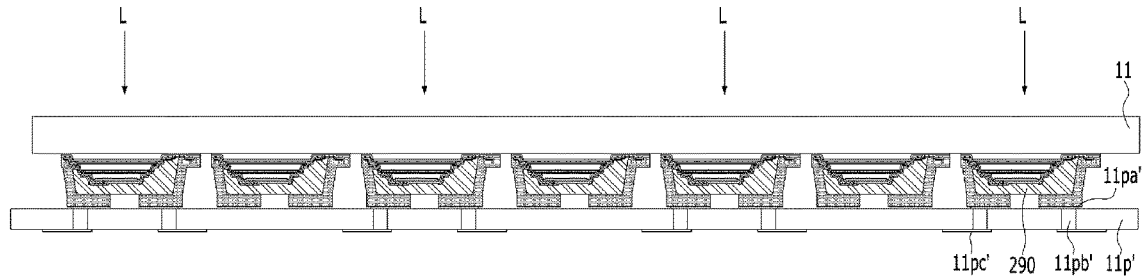
Figure 27:
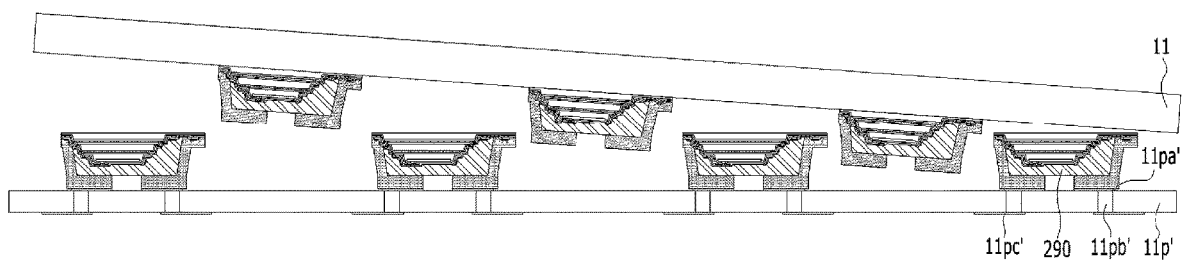

Referring to FIGS. 25 to 27, according to another exemplary embodiment, the growth substrate 11 is removed from selected light emitting chips 200, rather than the substrate 11 being removed from the light emitting chip 200 after the substrate 11 is cut as shown in FIGS. 23 and 24.

More particularly, an array of the light emitting chips 200 formed on the substrate 11 may be separated from each other through an isolation process, such that the third light emitting stack 40 formed substantially throughout the substrate 11 across the light emitting chips 200 may be separated from each other. In this case, the isolation process may be performed before or after forming the passivation layer 290 on the light emitting stacked structure.

Once the light emitting chips 200 are isolated from each other, such that at least a portion of the substrate 11 disposed between the light emitting chips 200 are exposed, the light emitting chips 200 are mounted on the circuit board 11p'. In this case, the lower circuit electrodes 11pa' may be formed to correspond to only a portion of the light emitting chips 200 formed on the substrate 11. Once the light emitting chips 200 are placed on the circuit board 11p', laser L may be selectively irradiated to the light emitting chips 200 to be transferred, as shown in FIG. 26. In this case, according to an exemplary embodiment, the connection electrodes of the light emitting chip 200 may be bonded to the lower circuit electrodes 11pa' of the circuit board 11p', respectively, by an anisotropic conductive film (ACF) bonding, for example.

When the light emitting chips 200 are bonded to the circuit board 11p' through ACF bonding, which may be performed at a lower temperature than in other bonding methods, the light emitting chips 200 may be protected from being exposed to a high temperature during bonding. However, the inventive concepts are not limited to a particular bonding method. For example, in some exemplary embodiments, the light emitting chips 200 may be bonded to the circuit board 11p' using an anisotropic conductive paste (ACP), solder, ball grid area (BGA), or micro bumps including at least one of Cu and Sn. In this case, since portions of the connection electrode overlapping the passivation layer 290 of the light emitting chip 200 are substantially planar as shown in FIG. 22B, the adhesiveness of the light emitting chips 200 to an anisotropic conductive film may be increased, thereby forming a more stable structure when bonded to the circuit board 11p'.

Referring to FIG. 27, then the substrate 11 may be lifted, and the light emitting chips 200 that were selectively irradiated with laser L may be mounted on the circuit board 11p'. The remaining light emitting chips 200 not irradiated with laser L may be lifted together with the substrate 11, and be later transferred to a different or the same circuit board 11p' as desired.

In some exemplary embodiments, a concave-convex portion may be formed on a surface of the top LED stack that is exposed from removing the substrate 11, to balance the visibility of light emitted from each light emitting stack.

Figure 28:
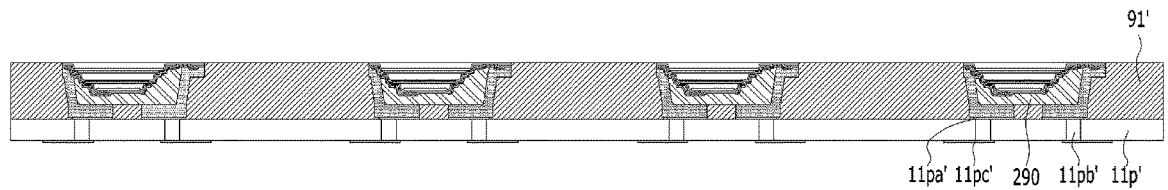

Referring to FIG. 28, once the light emitting chips 200 are mounted on the circuit board 11p', a molding layer 91' may be formed to surround at least the sides of the light emitting chips 200. According to an exemplary embodiment, the molding layer 91' may transmit a portion of light emitted from the light emitting chip 200, and may also reflect, diffract, and/or absorb a portion of external light to prevent the external light from being reflected by the light emitting chip 200 towards a direction that may be visible to a user. The molding layer 91' may surround at least the sides of the light emitting chip 200 to protect the light emitting chip 200 from external moisture and stress, and reinforce the structural configuration of the light emitting package to facilitate subsequent transfer and/or mounting processes.

According to the illustrated exemplary embodiment, the molding layer 91' may be formed between the connection electrodes 20ce', 30ce', 40ce', and 50ce' of the light emitting chip 200, and cover at least a portion of the passivation layer 290. The molding layer 91' according to an exemplary embodiment may include an epoxy molding compound (EMC), which may be formed to have various colors, such as black or transparent, without being limited thereto. For example, in some exemplary embodiments, the molding layer 91' may include a polyimide dry film (PID) that has photosensitivity. The molding layer 91' may be formed through various methods known in the art, such as lamination, transfer mold, and/or printing methods. For example, the molding layer 91' may be formed by a vacuum laminate process, in which an organic polymer sheet is disposed on the light emitting chip 200, and high temperature and pressure are applied in vacuum, to improve light uniformity by providing a substantially planar top surface of the light emitting package. In some exemplary embodiments, the molding layer 91' and the passivation layer 290 may include substantially the same material or different materials from each other.

Figure 29:
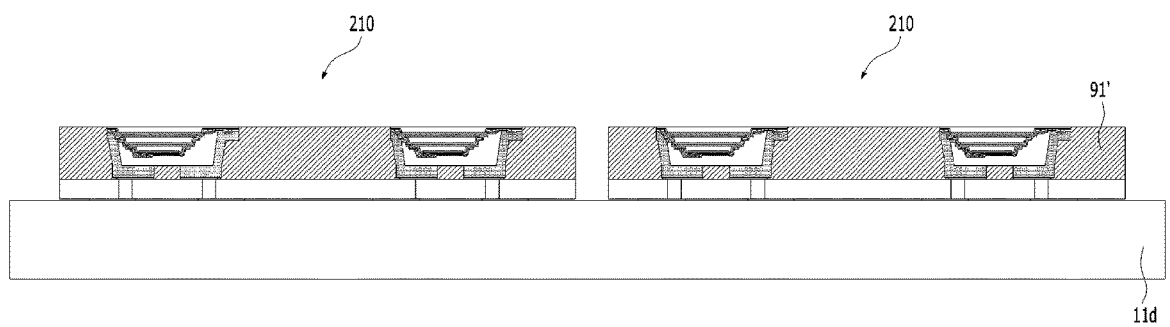

Referring to FIG. 29, the circuit board 11p' may be cut at a desired configuration to provide a light emitting package, in consideration of a final device to which the light emitting package may be mounted, such as a display device. For example, the light emitting package 210 may include one or more light emitting chips 200 arranged in n×m arrangement, where n and m are natural numbers. Although FIG. 29 exemplarily shows a light emitting package including two light emitting chips 200 therein, the inventive concepts are not limited to a particular number of light emitting chips 200 formed in one package.

According to the illustrated exemplary embodiment, the molding layer 91' may expose at least a portion of the light emitting chip 200. For example, a portion of the light emitting chip 200 that contacted the substrate 11 may be exposed by the molding layer 91', such as the third light emitting stack 40, to further increase light efficacy and color purity of light emitted from the light emitting chip 200. However, the inventive concepts are not limited thereto, and in some exemplary embodiments, the molding layer 91' may cover the portion of the light emitting chip 200 that contacted the substrate 11.

Figure 30:
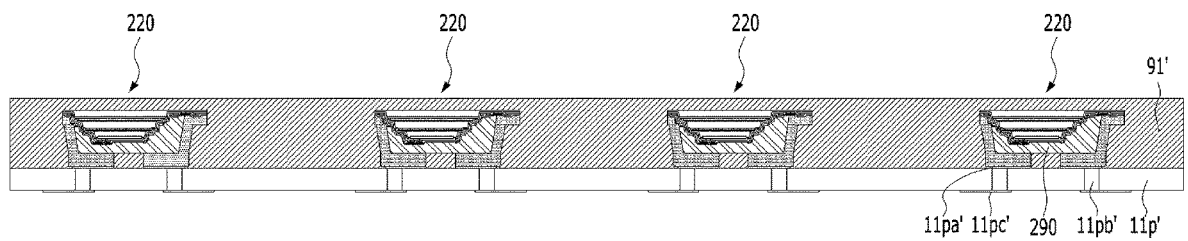
FIG. 30 is a schematic cross-sectional view illustrating a process of manufacturing the light emitting package of FIG. 20 according to another exemplary embodiment.

FIG. 30 is a schematic cross-sectional view illustrating a process of manufacturing the light emitting package of FIG. 20 according to another exemplary embodiment.

Referring to FIG. 30, according to an exemplary embodiment, the molding layer 91' may be formed to cover the light emitting chips 200 mounted on the circuit board 11p' shown in FIG. 27. In this manner, the molding layer 91' may protect the light emitting chip 200 from external stress or the like, and may also prevent external light from being reflected towards a user. In addition, the transmittance of light may be controlled by adjusting the thickness of the molding layer 91' or by forming the molding layer 91' with a material that provides a desired light transmittance. The circuit board 11p' then may be cut in a desired configuration to provide a light emitting package, such as the light emitting package 220 shown in FIG. 20, in consideration of a final device to which the light emitting package may be mounted, such as a display device. For example, the light emitting package 220 may include one or more light emitting chips 200 arranged in n×m arrangement, where n and m are natural numbers.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting module, comprising:
   a substrate having a first surface and a second surface opposing the first surface;
   a plurality of light emitters disposed on the first surface of the substrate, the plurality of light emitters comprises a first light emitter, a second light emitter, and a third light emitter, and at least two of the first, second, and third light emitters are disposed one over another;
   a plurality of connection electrodes having side surfaces and electrically connected to at least one of the first, second, or third light emitters, at least one of the plurality of connection electrodes covering a region of a side surface of at least one of the first, second, or third light emitters in a plan view;
   a passivation layer covering at least one side surface of the light emitters, the passivation layer including an opening to expose at least a region of the first light emitter facing the first surface of the substrate; and a first electrode disposed on the first surface of the substrate and electrically connected to at least one of the plurality of connection electrodes;

wherein the first electrode is electrically connected to at least one of the first, second, or third light emitters through the at least one of the plurality of connection electrodes, wherein each of the plurality of connection electrodes overlaps side surfaces of two or more of the first, second, and third light emitters in the plan view, and wherein the side surfaces of the two or more of the first, second, and third light emitters are inclined at a non-zero angle relative to a plane parallel to the first and second opposed surfaces of the substrate.

2. The light emitting module of claim 1, wherein the passivation layer has a region contacting the side surfaces of at least some of the plurality of connection electrodes.

3. The light emitting module of claim 2, wherein the region of the passivation layer is disposed between the plurality of connection electrodes.

4. The light emitting module of claim 1, wherein the passivation layer comprises at least one of a black epoxy molding compound and a polyimide film.

5. The light emitting module of claim 1, wherein the first electrode comprises a plurality of contact electrodes, each of which is spaced apart from each other and corresponds to one of the plurality of connection electrodes.

6. The light emitting module of claim 5, further comprising second electrodes disposed on the second surface of the substrate, each of which is spaced apart from each other and connected to respective ones of the contact electrodes.

7. The light emitting module of claim 1, wherein:

the first light emitter comprises a first light emitting layer;

the second light emitter comprises a second light emitting layer;

the third light emitter comprises a third light emitting layer;

the first, second, and third light emitting layers have successively smaller regions overlapping with the substrate; and at least one of the first, second, or third light emitting layers comprises a micro-LED having a surface area less than about 10,000 square µm.

8. The light emitting module of claim 1, wherein an angle defined between a side surface of the passivation layer and the first surface of the first light emitter is less than about 80°.

9. The light emitting module of claim 1, wherein at least one of the plurality of connection electrodes covers at least a side surface and a top surface of the passivation layer.

10. A light emitting module, comprising:

a substrate having a first surface and a second surface opposing the first surface;

a first light emitter disposed on first surface of the substrate and having a first surface and a second surface opposing the first surface;

a second light emitter disposed on the second surface of the first light emitter;

a third light emitter disposed on the substrate;

a plurality of connection electrodes having side surfaces and electrically connected to at least one of the first, second, or third light emitters, the plurality of connection electrodes covering a side surface of at least one of the first, second, or third light emitters in a plan view;

a passivation layer covering at least one side surface of the first, second, and third light emitters and having a region disposed on and covering the first light emitter; and a first electrode disposed on the substrate and electrically connected to at least one of the plurality of connection electrodes, wherein the first electrode is electrically connected to at least one of the first, second, or third light emitters through the at least one of the plurality of connection electrodes, wherein each of the plurality of connection electrodes overlaps side surfaces of the first and second light emitters in the plan view, and wherein the side surfaces of the first and second light emitters are inclined at a non-zero angle relative to a plane parallel to the first and second opposed surfaces of the substrate.

11. The light emitting module of claim 10, wherein the region of the passivation layer disposed on the first surface of the first light emitter has a thickness of less than about 100 µm.

12. The light emitting module of claim 10, wherein the passivation layer contacts the first surface of the first light emitter.

13. The light emitting module of claim 10, further comprising a second electrode disposed on the second surface of the substrate and electrically connected to the first electrode.

14. The light emitting module of claim 13, wherein the second electrode includes a first region overlapping at least one of the first, second, or third light emitters and having a first area, and a second region not overlapping at least one of the first, second, or third light emitters and having a second area that is greater than the first area.

15. The light emitting module of claim 10, wherein the passivation layer has a region contacting at least side surfaces of the plurality of connection electrodes.

16. The light emitting module of claim 10, wherein at least one of the plurality of connection electrodes contacts a side surface and a top surface of the passivation layer.

17. The light emitting module of claim 10, wherein at least one of the plurality of connection electrodes has an angled shape.

18. The light emitting module of claim 10, wherein the passivation layer has a region disposed between the plurality of connection electrodes.

19. The light emitting module of claim 10, wherein:

at least one of the plurality of connection electrodes has a first surface and a second surface opposing the first surface of the at least one of the plurality of connection electrodes, with the first surface of the at least one of the plurality of connection electrodes facing the first, second, and third light emitters; and the first surface of the at least one of the plurality of connection electrodes has an area greater than an area of the second surface of the at least one of the plurality of connection electrodes.

20. The light emitting module of claim 1, wherein the non-zero angle is greater than 0° and less than 90°.

* * * * *